United States Patent
Yamamoto et al.

(10) Patent No.: US 11,431,332 B2
(45) Date of Patent: Aug. 30, 2022

(54) GATE DRIVE CIRCUIT

(71) Applicant: DENSO CORPORATION, Kariya (JP)

(72) Inventors: Masahiro Yamamoto, Kariya (JP); Akimasa Niwa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/072,724

(22) Filed: Oct. 16, 2020

(65) Prior Publication Data

US 2021/0036697 A1    Feb. 4, 2021

Related U.S. Application Data

(63) Continuation-in-part of application No. 16/503,725, filed on Jul. 5, 2019, now Pat. No. 10,979,039.

(30) Foreign Application Priority Data

Jul. 12, 2018 (JP) .............................. JP2018-132344

(51) Int. Cl.
*H03K 17/082* (2006.01)
*H03K 17/08* (2006.01)

(52) U.S. Cl.
CPC ..... *H03K 17/0822* (2013.01); *H03K 17/0826* (2013.01); *H03K 2017/0806* (2013.01)

(58) Field of Classification Search
CPC ............... H03K 17/002; H03K 17/168; H03K 17/0822; H03K 17/0826
See application file for complete search history.

(56) References Cited

U.S. PATENT DOCUMENTS

| 4,093,915 A | 6/1978 | Briefer |
| 5,866,968 A | 2/1999 | Mech |
| 7,092,235 B2 * | 8/2006 | Clevenger ............... H01G 4/255 |
| | | 257/E21.008 |
| 9,172,365 B2 | 10/2015 | Kandah et al. |
| 2003/0045041 A1 | 3/2003 | Katoh et al. |
| 2003/0201516 A1 | 10/2003 | Katoh et al. |
| 2007/0187217 A1 | 8/2007 | Tai |
| 2010/0008113 A1 | 1/2010 | Kuno et al. |

FOREIGN PATENT DOCUMENTS

| JP | 2006-42413 A | 2/2006 |
| JP | 2006-42565 A | 2/2006 |
| JP | 2013-27217 A | 2/2013 |
| JP | 2013-219910 A | 10/2013 |

* cited by examiner

*Primary Examiner* — Jung Kim
(74) *Attorney, Agent, or Firm* — Posz Law Group, PLC

(57) ABSTRACT

A gate drive circuit includes a driver for driving a gate of a switching element, a peak voltage detector, and a drive capacity calculator. The peak voltage detector detects a peak voltage at a main terminal of the switching element when the switching element is OFF. The drive capacity calculator calculates a voltage difference value between the detected peak voltage and an allowable voltage value at the main terminal of the switching element, where the allowable voltage is based on the specifications of the switching element. The drive capacity calculator changes a drive capacity of the driver to gradually decrease the difference between the detected peak voltage and the allowable voltage.

13 Claims, 17 Drawing Sheets

GATE DRIVE CIRCUIT

CROSS REFERENCE TO RELATED APPLICATION

The present application is a Continuation-in-Part and is based on and claims the benefit of non-provisional U.S. patent application Ser. No. 16/503,725 filed on Jul. 5, 2019, which issued on Apr. 13, 2021 as U.S. Pat. No. 10,979,039, and which is based on and claims the benefit of priority of Japanese Patent Application No. 2018-132344, filed on Jul. 12, 2018, the disclosures of which are incorporated herein by reference.

TECHNICAL FIELD

The present disclosure relates to a gate drive circuit for driving a gate of a switching element.

BACKGROUND INFORMATION

In gate drive circuits that drive the gates of switching elements such as insulated-gate bipolar transistors (IGBTs) or metal-oxide-semiconductor field-effect transistors (MOSFETs), surge voltages exceeding the breakdown voltage of the switching element may cause failures in the switching element. The suppression effects by gate drive circuits to mitigate excessive surge voltages may create additional issues in the switching elements. As such, gate drive circuits are subject to improvement by including integrated capacitors in a peak voltage detector for the gate drive circuit.

SUMMARY

The present disclosure describes a peak voltage detector for a gate drive circuit for driving a switching element that can suppress surge voltages without increasing switching losses in the switching element. The gate drive circuit may include a peak voltage detector including integrated capacitors.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
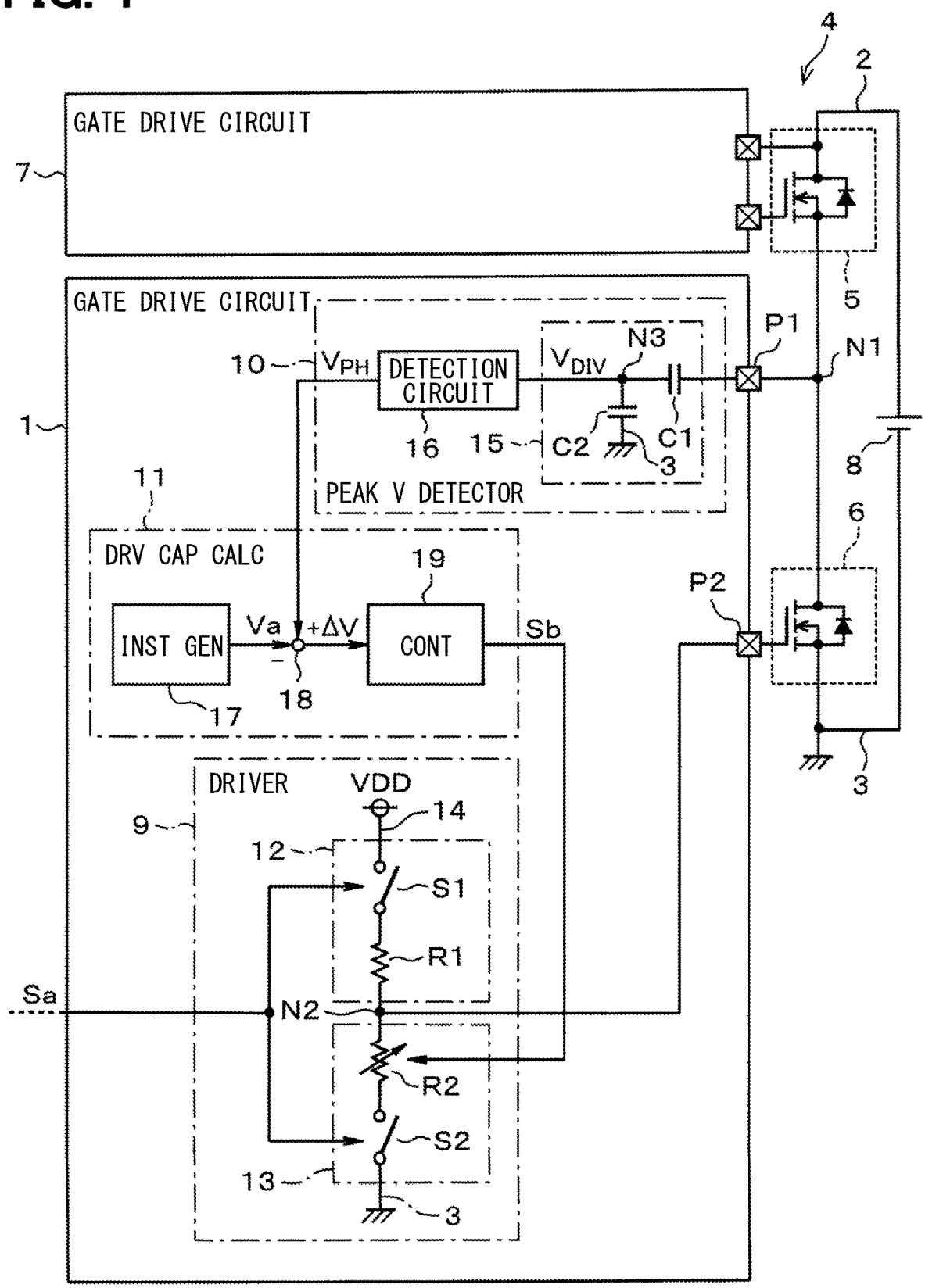
FIG. 1 illustrates a gate drive circuit schematic in a first embodiment of the present disclosure.

In gate drive circuits that drive the gates of switching elements such as insulated-gate bipolar transistors (IGBTs) or metal-oxide-semiconductor field-effect transistors (MOSFETs), surge voltages exceeding the breakdown voltage of the switching element may cause failures in the switching element.

The surge voltage is a voltage based on the parasitic inductance component of the electric current path and the change rate of the electric current (di/dt). Therefore, it is possible to reduce and/or eliminate (i.e., suppress) the surge voltage by reducing the change rate of the electric current (di/dt) by lowering a drive capacity of a driver, where the drive capacity of the driver may be determined by the resistance value of the gate resistor. For example, the drive capacity may be determined based on worst-case conditions that generate the highest surge voltage. That is, the drive capacity may be determined in view of the high voltage and large current regions, and the determined drive capacity based on such condition may be employed to drive the gate for all operating conditions of the switching element.

In such manner, the surge voltage can be prevented from exceeding the breakdown voltage of the transistor for all operating conditions. However, in a low-voltage, small-current region having operating conditions where the surge voltage is generated as a relatively low voltage, the suppression effects of the above-determined drive capacity may be excessive. The excessive suppression effects may increase the switching losses in the transistor due to the low drive capacity, and such switching losses may be problematic. That is, there is a trade-off between suppressing the surge voltage and reducing the switching losses in the transistor.

On the other hand, gate drive circuits may prevent increases in the switching loss while suppressing the surge voltage by monitoring both a collector-emitter voltage (i.e., a voltage between the collector and the emitter) and a main current and by adjusting a gate current based on the monitored voltage and current. However, for the gate drive circuits using this technique, the gate current is adjusted when the monitored collector-emitter voltage reaches an arbitrary threshold value. Because the characteristics of the transistor and the drive conditions may vary, the optimum adjustment of the gate current cannot always be achieved. As such, gate drive circuits using conventional techniques cannot achieve both a simultaneous suppression of the surge voltage while also reducing the switching losses in the transistor.

The present disclosure describes embodiments of a gate drive circuit for driving a switching element that can suppress surge voltages without increasing switching losses in the switching element.

Multiple embodiments of a gate drive circuit are described with reference to the drawings. In the following embodiments, like features and elements among the embodiments may be referred to by the same reference numerals, and a repeat description of previously described like features and elements may be omitted from the descriptions of the latter embodiments.

First Embodiment

The first embodiment of the present disclosure is described with reference to FIGS. 1-4.

Overall Configuration

With reference to FIG. 1, a gate drive circuit 1 of the present embodiment is used to drive a gate of a switching element 6. The switching element 6 is one of a pair of switching elements along with a switching element 5 that together form a half-bridge circuit 4. The switching element 6 is on a low potential side of the half-bridge circuit 4, and the switching element 5 is on a high potential side of the half-bridge circuit 4. The switching elements 5 and 6 are respectively connected at a position between a pair of direct current (DC) power supply lines 2 and 3. The switching element 5 on the high potential side is driven by a gate drive circuit 7. The drive of the switching elements 5 and 6 is PWM controlled based on externally provided control signals.

The switching elements 5 and 6 are power elements such as transistors. For example, in the present embodiment, the switching elements 5 and 6 may be N-channel power metal-oxide-semiconductor field-effect-transistors (i.e., n-type power MOSFETs).

For the high potential side switching element 5, the drain is connected to the high potential side DC power supply line 2 that is connected to a high potential side terminal of a DC power supply 8.

The DC power supply 8 may be a DC power source such as a battery. The power supply voltage output from the DC power supply 8 is a relatively high voltage, for example, 600V.

The source of the high potential side switching element 5 is connected to the drain of the low potential side switching element 6. The source of the low potential side switching element 6 is connected to the low potential side DC power supply line 3 that is connected to a low potential side terminal of the DC power supply 8. Although not shown in the drawing, an electric load such as an inductor or a motor winding can be connected to the node N1. The node N1 is connected to both the switching elements 5 and 6 at a position between the switching elements 5 and 6.

The gate drive circuit 1 includes a terminal P1 connected to the node N1 and a terminal P2 connected to the gate of the low potential side switching element 6. The gate drive circuit 1 also includes a driver 9, a peak voltage detector 10, and a drive capacity calculator 11.

The driver 9 drives the gate of the switching element 6 based on an externally-provided control signal Sa. Here, the external control signal Sa means a signal from the outside of the gate drive circuit 1 that is sent to the driver 9 to control the ON and OFF switching of the switching element 6. The driver 9 includes an ON driver 12 and an OFF driver 13.

The ON driver 12 includes a switch S1 and a gate resistor R1. The switch S1 opens to break a connection and closes to complete a connection between a power supply line 14 and one terminal of the gate resistor R1. A power supply voltage VDD is supplied via the power supply line 14. The power supply voltage VDD is a voltage sufficiently higher than a gate threshold voltage of the switching element 6. For example, the power supply voltage VDD may be 5 V. The other terminal of the gate resistor R1 is connected to a node N2 that is connected to the terminal P2.

The OFF driver 13 includes a switch S2 and a gate resistor R2. The switch S2 opens to break a connection and closes to complete a connection between the DC power supply line 3 and one terminal of the gate resistor R2. The DC power supply line 3 is connected to a return path of the power supply voltage VDD (e.g., a chassis ground). The other terminal of the gate resistor R2 is connected to the node N2. The switch S1 of the ON driver 12 and the switch S2 of the OFF driver 13 are complementarily turned ON and OFF based on the control signal Sa.

The switch S1 is turned ON to turn ON the switching element 6 and the switch S2 is turned ON to turn OFF the switching element 6. In such a case, the ON driver 12 is configured to drive the gate of the switching element 6 by a constant voltage, but may also be configured to drive the gate of the switching element 6 by a constant current.

The gate resistor R2 is a variable resistor with a variable resistance value. As such, a drive capacity of the driver 9 can be changed. More specifically, the drive capacity of the driver 9 when turning OFF the switching element 6 can be changed. The drive capacity of the driver 9, that is, the resistance value of the gate resistor R2, is set to a certain value based on a capacity instruction signal Sb output from the drive capacity calculator 11.

The peak voltage detector 10 detects a peak voltage of a main terminal of the switching element 6 when the switching element 6 is OFF. That is, the peak voltage detector 10 detects the peak surge voltage (i.e., the peak of the surge voltage) generated when the switching element 6 is turned OFF. The main terminal may refer to a terminal on the switching element 6 in the main current supply path in the direction of the main current flow that receives the main current. Thus, the main terminal of the switching element 6 may depend on the configuration of the switching element 6. The main terminal may refer to one or more of a drain terminal, a source terminal, a collector terminal, an emitter terminal, a base terminal, a gate terminal, or a like terminal on the switching element 6. For example, the main terminal may refer to the drain terminal of the switching element 6. In such a case, the peak voltage of the main terminal of the switching element 6 is a peak drain voltage of the switching element 6 with reference to the potential of the DC power supply line 3 on the low potential side. That is, the peak voltage is a peak drain-source voltage VDS of the switching element 6.

The peak voltage detector 10 includes a voltage divider 15 and a detection circuit 16. The voltage divider 15 includes two capacitors C1 and C2. One terminal of the capacitor C1 is connected to the terminal P1, and the other terminal of the capacitor C1 is connected to the DC power supply line 3 via the capacitor C2. The capacitors C1 and C2 of the voltage divider 15 are connected in series, and the capacitors C1 and C2 have a high breakdown voltage (e.g., 600 V) for preventing failure/breakdowns in the capacitors C1 and C2, even if high voltages generated at the node N1 are applied to the voltage divider 15.

The voltage divider 15 divides the voltage at the node N1, i.e., the drain-source voltage $V_{DS}$ of the switching element 6, by the capacitance ratio of the capacitors C1 and C2. The voltage divider 15 outputs the divided voltage from a node N3, which is an interconnection node of the capacitors C1 and C2. The capacitors C1 and C2 may be formed on the same, single semiconductor chip.

The detection circuit 16 receives the divided voltage $V_{DIV}$ from the voltage divider 15 as an input, and outputs a peak hold voltage $V_{PH}$. The peak hold voltage $V_{PH}$ holds the peak of the divided input voltage. The detection circuit 16 may also be referred to as the peak hold circuit 16. The peak hold voltage $V_{PH}$ output from the detection circuit 16 is a voltage value corresponding to a peak voltage detection value. As such, the peak hold voltage $V_{PH}$ may also be referred to as a "detection voltage" $V_{PH}$.

The drive capacity calculator 11 performs a feedback control such as changing the drive capacity of the driver 9 so that the detection value by the peak voltage detector 10, that is, the detection value of the peak surge voltage, can be controlled to match a desired instruction value. In such a case, the desired instruction value is an allowable surge voltage.

The allowable surge voltage is set to a value that is lower than the breakdown voltage of the switching element 6 by a predetermined margin. By setting the allowable surge voltage in this manner, even when the set value voltage is applied to the main terminal, the possibilities of causing a failure to the switching element 6 are limited and/or prevented. However, if a voltage exceeding the set value is applied to the main terminal, there is a possibility that the switching element 6 may fail. In other words, the allowable surge voltage corresponds to an allowable voltage value of the main terminal determined by the specifications and characteristics of the switching element 6. Such specifications and characteristics of the switching element 6 may be the performance data for the switching element 6, for example, as given on a datasheet of the switching element. The allowable surge voltage, as determined, for example, by a datasheet for the switching element 6, may be set in advance and stored in the gate drive circuit 1. In the present embodiment, the allowable surge voltage is set to, for example, 1200 V.

The drive capacity calculator 11 includes an instruction generator 17, a subtractor 18, and a controller 19. The instruction generator 17 generates an instruction voltage Va corresponding to the allowable surge voltage taking the characteristics, specifications, and performance of the switching element 6 into consideration (e.g., datasheet data of the switching element 6). The subtractor 18 subtracts the instruction voltage Va from the detection voltage $V_{PH}$ to obtain a voltage deviation $\Delta V$ value corresponding to a difference between the detected value of the peak surge voltage and the instruction value, and outputs the voltage deviation $\Delta V$ value to the controller 19. The controller 19 performs a proportional-integral (PI) calculation on the voltage deviation value $\Delta V$ to generate a capacity setting signal Sb. The capacity setting signal Sb is output to the driver 9 to set the resistance value of the gate resistor R2. That is, the capacity setting signal Sb is used to set the drive capacity of the driver 9 when the driver 9 is OFF (i.e., turned OFF).

The drive capacity calculator 11 in the present embodiment and the drive capacity calculators in the subsequent embodiment (e.g., the drive capacity calculators 23, 33, 43, 52, 92) may be realized as a small computer (i.e., microcomputer) such as a microcontroller or a system on a chip (SoC). As such, the drive capacity calculator 11 may include one or more CPUs or like processors, memory such as RAM, ROM, and flash memory, and inputs and outputs (I/Os) (all not shown in the drawings). The respective functions performed by the drive capacity calculator 11 and the components in the drive capacity calculator 11 such as the instruction generator 17, the subtractor 18, and the controller 19 may be realized by executing a program or instruction set stored in a non-transitory memory. The memory of the drive capacity calculator 11 may be used to store programs and instructions sets in addition to other data. For example, the performance specifications and characteristics of the switching element 6 used to determine the allowable voltage (i.e., instruction value Va) may be stored in the drive capacity calculator 11 in advance. As another example, a drive capacity of a driver 9 calculated in a previous PWM driving cycle may be stored in the memory of the drive capacity calculator 11.

Alternatively, the instruction generator 17 and the controller 19 in the drive capacity calculator 11 may be realized as small computers (i.e., microcomputers) such as microcontrollers or systems on a chip (SoCs). The instruction generator 17 and the controller 19 may also be realized as specialized hardware circuits configured to perform the functions associated with the instruction generator 17 and the controller 19. For example, the instruction generator 17 and the controller 19 may be realized as application-specific integrated circuits (ASICs) or field-programmable gate arrays (FPGAs), or as other hardware circuits including any combination of analog, digital, and logical circuit components.

With such a configuration, the drive capacity calculator 11 calculates the voltage deviation value $\Delta V$ corresponding to the difference between the detected peak surge voltage value and the allowable surge voltage, which is the desired instruction value, and changes the drive capacity of the driver 9 to gradually decrease the voltage deviation value $\Delta V$ to a smaller value. In such a case, the voltage deviation value $\Delta V$ corresponds to a margin of voltage indicating how much extra voltage can still be preserved/maintained between the peak surge voltage and the breakdown voltage of the switching element 6 at the time of calculating the voltage deviation value $\Delta V$. In other words, the drive capacity calculator 11 is configured to change the drive capacity of the driver 9 so as to gradually decrease the margin.

In such a case, the drive capacity calculator 11 calculates the voltage deviation value $\Delta V$ (i.e., margin) in every drive cycle of the switching element 6 (i.e., for each drive cycle of the switching element 6). Alternatively, the drive capacity calculator may calculate the voltage deviation value $\Delta V$ over a plurality of drive cycles of the switching element 6 (i.e., for a plurality of drive cycles of the switching element 6). In the present embodiment, the drive cycle of the switching element 6 is one cycle of PWM control. In such a case, the drive capacity calculator 11 is configured to change the drive capacity of the driver 9 in a predetermined PWM cycle based on the voltage deviation value $\Delta V$ calculated in a prior PWM cycle, that is, in the cycle before the predetermined PWM cycle. More specifically, the drive capacity calculator 11 calculates the voltage deviation value $\Delta V$ in every PWM cycle, and changes the drive capacity of the driver 9 in the current PWM cycle based on the voltage deviation value ΔV calculated in the previous PWM cycle.

Specific Configuration of the Peak Voltage Detector

Figure 2:
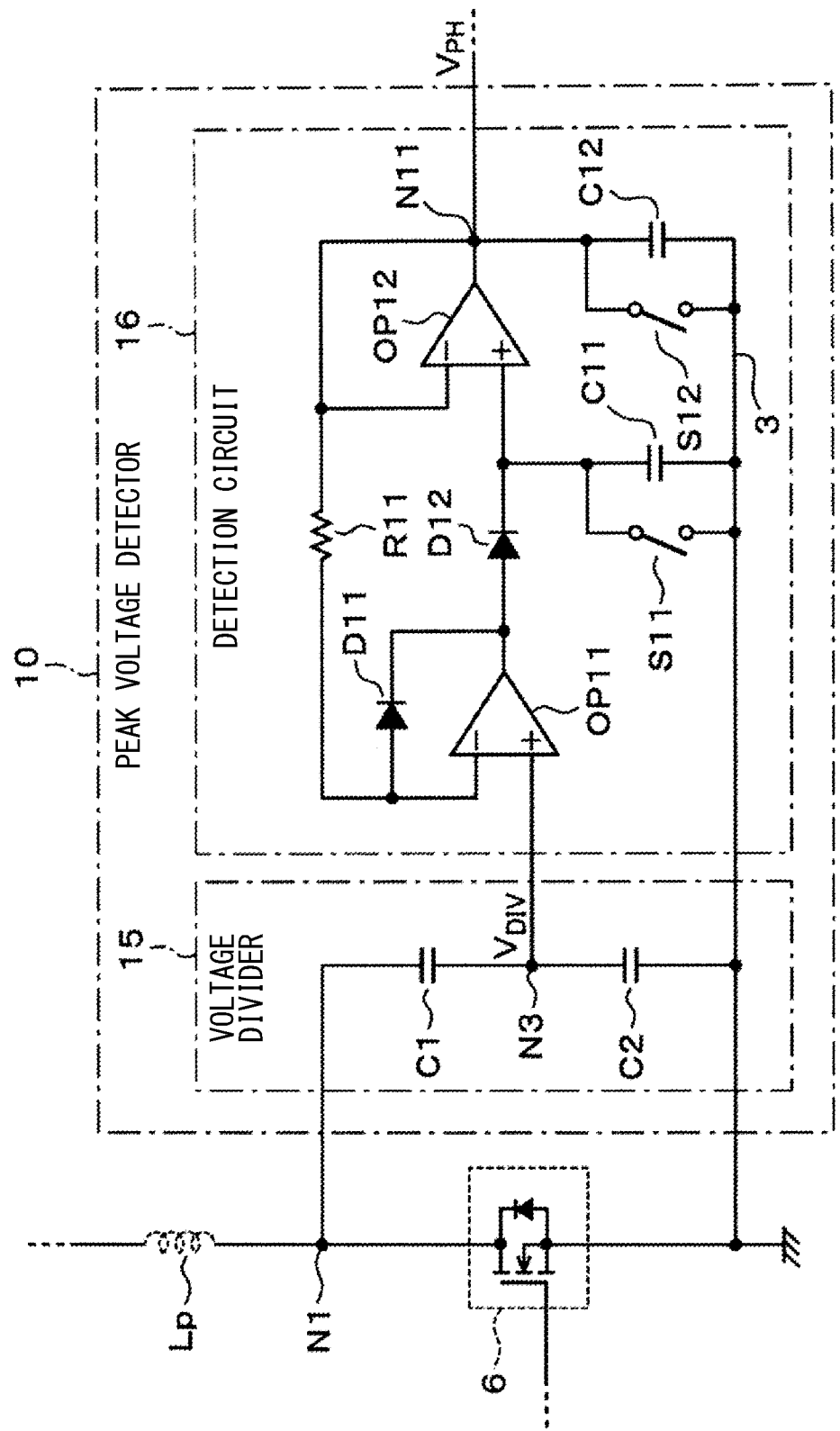
FIG. 2 illustrates a peak voltage detector schematic in the first embodiment.

An example configuration of the peak voltage detector 10 is shown with greater specificity in FIG. 2. In the specific configuration example shown in FIG. 2, the detection circuit 16 is configured as a peak hold circuit including operational amplifiers (op-amps) OP11 and OP12, diodes D11 and D12, capacitors C11 and C12, a resistor R11, and switches S11 and S12. In FIG. 2, an inductor Lp indicated by a broken line is a parasitic inductor in the wiring path (i.e., electrical path) between the node N1 and the switching element 5 on the high potential side.

The non-inverting input terminal of the amplifier OP11 is connected to the node N3. The inverting input terminal of the amplifier OP11 is connected to the output terminal of the amplifier OP11 via the diode D11, where the diode D11 is arranged in a forward direction. The anode of the diode D11 is connected to the inverting input of the amplifier OP11 and the cathode of the diode D11 is connected to the output of the amplifier OP11. The output terminal of the amplifier OP11 is connected to the non-inverting input terminal of the amplifier OP12 via the diode D12, where the diode D12 is arranged in a forward direction.

The non-inverting input terminal of the amplifier OP12 is connected to the DC power supply line 3 via the capacitor C11. The inverting input terminal of the amplifier OP12 is connected to the inverting input terminal of the amplifier OP11 via the resistor R11. The inverting input terminal of the amplifier OP12 is also connected to the output terminal of the amplifier OP12. The output terminal of the amplifier OP12 is connected to the DC power supply line 3 via the capacitor C12. The output terminal of the amplifier OP12 is connected to a node N11 that is an output node of the detection circuit 16. The switch S11 is configured to open and close to open and close the terminals of the capacitor C11, and the switch S12 is configured to open and close to open and close the terminals of the capacitor C12.

The detection circuit 16, as configured as described above, holds a positive maximum value of the divided voltage $V_{DIV}$ that is input by a negative feedback effect of the capacitor C11, and outputs the positive maximum voltage detection value $V_{PH}$ corresponding to the peak of the surge voltage from the output node N11. The capacitor C12 stores (i.e., holds) and stabilizes the output voltage of the detection circuit 16, that is, the detection voltage $V_{PH}$.

In the above-described configuration, the switches S11 and S12 may be used to respectively reset the electric charge of the capacitors C11 and C12, and are respectively turned ON in every PWM cycle. As such, the switches S11 and S12 may be referred to respectively as the reset switch S11 and the reset switch S12. With this configuration, the electric charge of the capacitors C11 and C12 is discharged, and the detection voltage $V_{PH}$ output from the detection circuit 16 is reset for each PWM cycle.

The detection circuit 16 may be configured as a semiconductor integrated circuit (IC), i.e., as a monolithic IC/chip. When the detection circuit 16 is configured as an IC, the two capacitors C1 and C2 that make up the voltage divider 15 can be formed as part of the IC.

Figure 3:
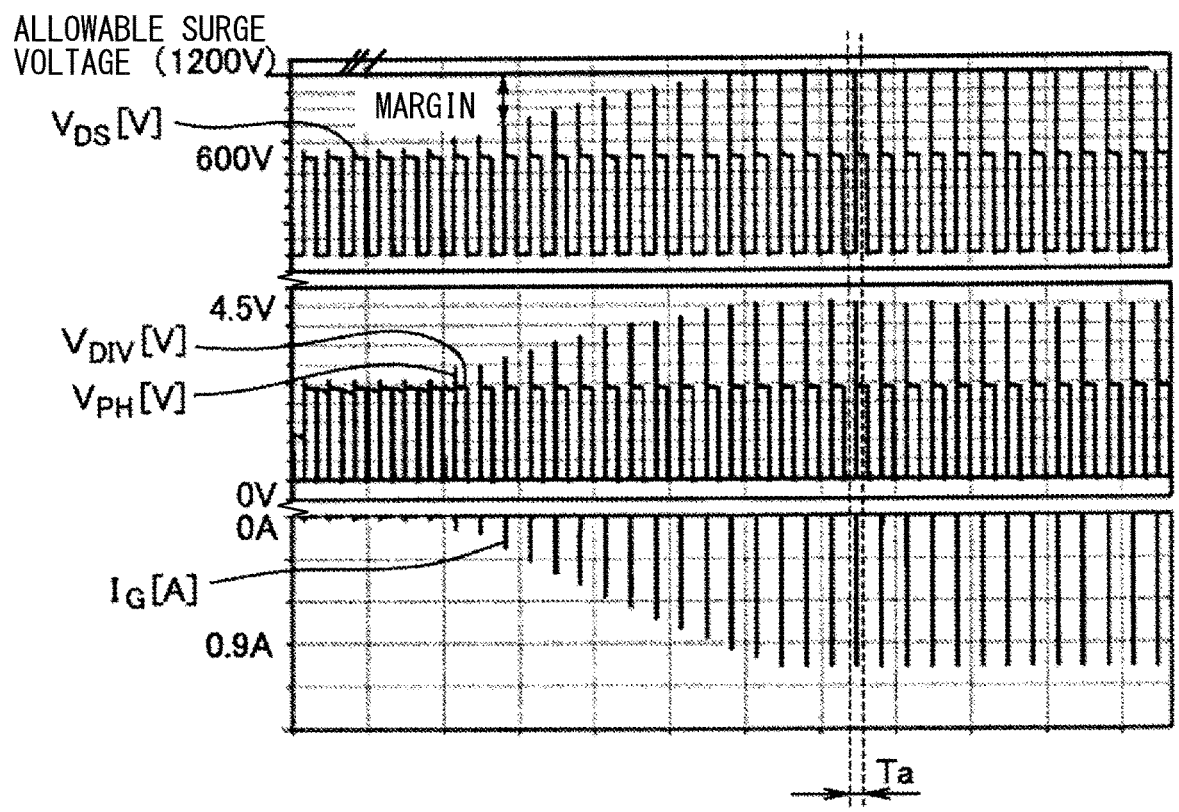
FIG. 3 is a time diagram of operational waveforms in the first embodiment.
Figure 4:
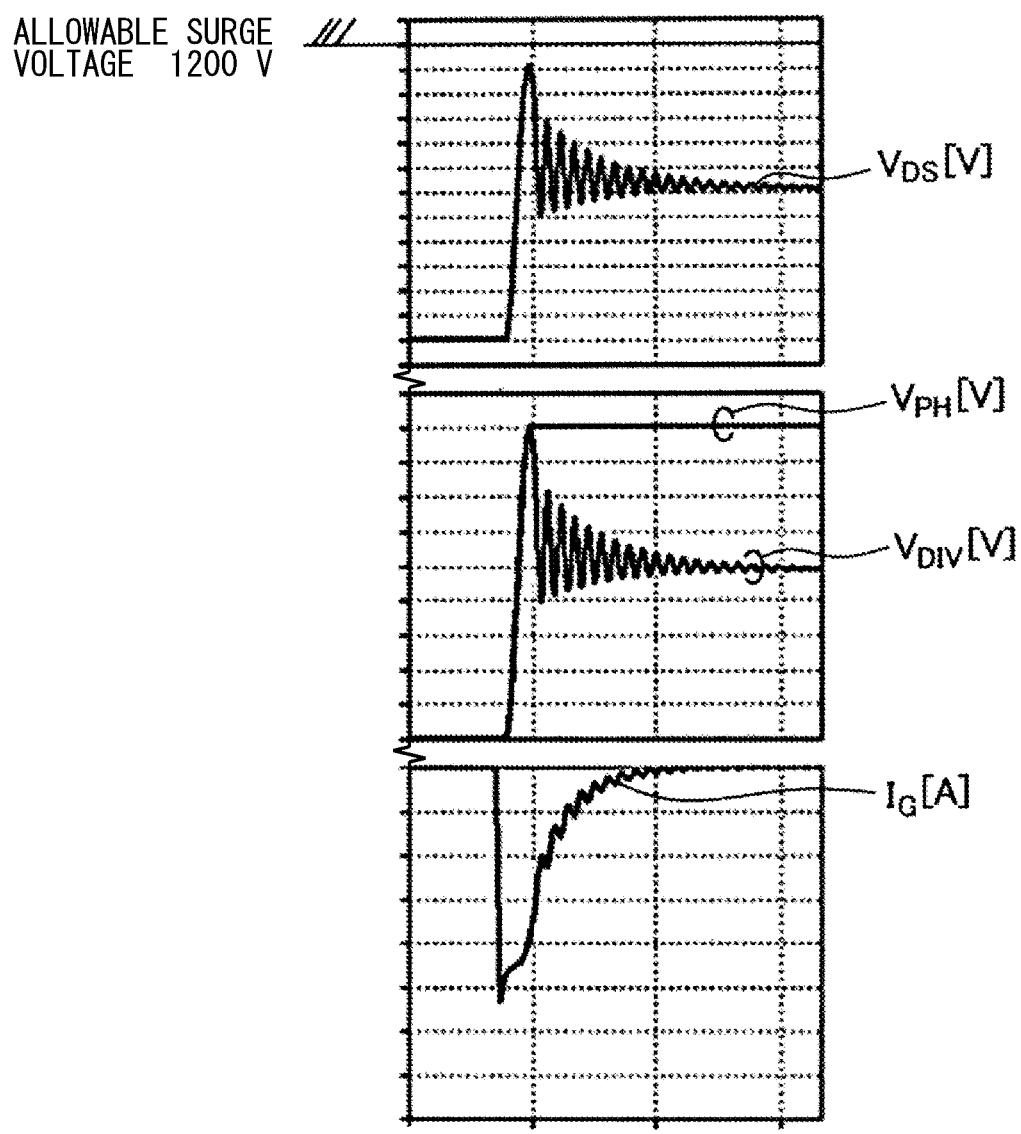
FIG. 4 is a time diagram of the operational waveforms in the first embodiment showing an enlarged view of a period Ta in FIG. 3.

The operational effects of the gate drive circuit 1 and half-bridge circuit 4 are described with reference to FIGS. 3 and 4. The operational waveforms of the inputs and outputs of various parts in the gate drive circuit 1 and the half-bridge circuit 4 are shown in FIGS. 3 and 4. FIG. 4 illustrates an enlarged view of a period Ta in FIG. 3. In the configuration as shown in FIG. 1, the drain-source voltage $V_{DS}$ between the drain and the source of the switching element 6 is about 0 V during the period (i.e., ON period) when the switching element 6 is turned ON, and is about 600 V during the period (i.e., OFF period) when the switching element 6 is turned OFF. The OFF period voltage of 600 V is the voltage of the power supply 8.

However, as shown in FIG. 3, when the switching element 6 is turned OFF, the peak of the drain-source voltage $V_{DS}$ of the switching element 6 takes a voltage value that is higher than the voltage value of the power supply, i.e., higher than 600 V, due to the rate of change of the current (i.e., di/dt) in the parasitic inductor Lp. The peak of the drain-source voltage $V_{DS}$, that is, the peak of the surge voltage changes in accordance with the drive capacity of the driver 9 when the driver 9 is OFF (i.e., turned OFF).

More specifically, the peak of the surge voltage decreases when the drive capacity is decreased (i.e., lowered), and the peak of the surge voltage increases when the drive capacity is increased (i.e., raised). When starting the drive of the switching element 6, the drive capacity calculator 11 at first sufficiently lowers the drive capacity of the driver 9 when the driver 9 is turned OFF. For example, in the initial period when the drive of the switching element 6 begins, the peak of the surge voltage has a value slightly higher than 600 V, which is sufficiently lower than the allowable surge voltage of 1200 V.

When the switching element 6 is turned OFF, the gate current $I_G$ of the switching element 6 increases as the drive capacity increases, and the gate current $I_G$ decreases as the drive capacity decreases. As seen in FIG. 3, the drive capacity of the driver 9 is low when the gate current $I_G$ is small, and the drive capacity is high when the gate current $I_G$ is large.

After starting the drive of switching element 6, the drive capacity calculator 11 changes the drive capacity when the driver 9 is turned OFF, to gradually decrease the voltage deviation value ΔV, that is, to gradually decrease the margin of the surge voltage. Again, the voltage deviation value ΔV is the difference between the detection voltage $V_{PH}$ and the instruction voltage Va. The drive capacity calculator 11 optimizes the drive capacity of the driver 9 when the driver 9 is turned OFF based on the margin of the surge voltage.

By optimizing the drive capacity, the drive capacity of the driver 9 when the driver 9 is turned OFF is increased until the peak surge voltage substantially matches the allowable surge voltage. For example, the peak of the drain-source voltage $V_{DS}$ of the switching element 6 (i.e., the peak surge voltage) is a voltage that substantially matches the allowable surge voltage in the period Ta. The period Ta is a period of time that begins after a predetermined amount of time from when the switching element 6 begins to be driven (i.e., the start of the drive of the switching element 6).

The configuration of the gate drive circuit 1 and the bridge circuit 4 can achieve the following advantageous effects.

In the gate drive circuit 1 of the present embodiment, the drive capacity calculator 11 calculates the voltage deviation value ΔV corresponding to a difference between the peak of the drain-source voltage $V_{DS}$ of the switching element 6 and the allowable surge voltage. The peak drain-source voltage $V_{DS}$ is detected by the peak voltage detector and corresponds to the peak surge voltage. In other words, the drive capacity calculator 11 calculates the margin to the breakdown voltage, that is, the amount of voltage margin between the peak of the surge voltage when the voltage deviation value ΔV is calculated and the breakdown voltage of the switching element 6.

Then, the drive capacity calculator 11 changes the drive capacity of the driver 9 when the driver 9 is turned OFF, to gradually decrease the voltage deviation value ΔV, that is, to gradually decrease the margin of the surge voltage. In such manner, the drive capacity of the driver 9 when the driver is OFF is optimized based on the margin of the surge voltage. By optimizing the drive capacity in such manner, the gate drive circuit 1 can limit and/or prevent a surge voltage exceeding the allowable value from being applied to the switching element 6 as the drain-source voltage for any operating conditions, even when the characteristics (e.g., performance specifications) for the circuit elements such as the switching element 6 vary.

By performing the above-described optimization, the drive capacity of the driver 9 when the driver 9 is turned OFF can be raised to bring the peak of the surge voltage as close as possible to the breakdown voltage of the switching element 6 for any operating conditions. As a result, the switching losses in the switching element 6 can be reduced. As such, the gate drive circuit 1 of the present embodiment can suppress (i.e., reduce and/or eliminate) the surge voltage without increasing the switching loss of the switching element 6.

With the configuration of the gate drive circuit 1 in the present embodiment, the drive capacity is optimized to gradually decrease the margin. In instances where the drive capacity is changed so as to steeply (i.e., quickly) decrease the margin relative to the breakdown voltage, the peak of the surge voltage may temporarily exceed the allowable value, i.e., the breakdown voltage. On the other hand, the gate drive circuit 1 of the present embodiment is configured so that in instances where the drive capacity is changed so as to gradually (i.e., slowly) decrease the margin, the gate drive circuit 1 can limit and/or prevent periods where the peak surge voltage exceeds the allowable voltage.

The peak voltage detector 10 includes the voltage divider 15 and the detection circuit 16. The voltage divider 15 divides the drain-source voltage $V_{DS}$ of the switching element 6. The detection circuit 16 receives the divided voltage $V_{DIV}$ from the voltage divider 15 and outputs a peak hold voltage $V_{PH}$ that holds the peak of the divided input voltage. With this configuration, the drain-source voltage $V_{DS}$ between the drain and the source of the switching element 6, which is relatively high, is divided to a relatively low voltage by the voltage divider 15. As such, the detection circuit 16 is exposed to a relatively low, after-division voltage $V_{DIV}$, which allows for a size reduction in the circuit size of the detection circuit 16.

In the present embodiment, the voltage divider 15 is a capacitive divider with two capacitors C1 and C2 connected in series. Such a configuration improves the responsiveness of the voltage divider 15, as compared to a resistive divider that uses resistors in place of the capacitors. Further, the two capacitors C1 and C2 are formed on the same semiconductor chip. In such manner, the relative accuracy of the capacitances of the capacitors C1 and C2 is improved, which improves the accuracy of the voltage dividing ratio of the voltage divider 15.

As described above, the detection circuit 16 can be configured as an IC (i.e., chip), because the configuration detects a relatively low voltage after voltage division of pre-division high voltage. When the detection circuit 16 is configured as an IC, the two capacitors C1 and C2 that make up the voltage divider 15 can be formed as part of the IC. In such manner, the relative accuracy of the capacitances of the capacitors C1 and C2 is improved, which improves the accuracy of the voltage dividing ratio of the voltage divider 15.

The detection circuit 16 is a peak hold circuit that includes the amplifiers OP1 and OP2 as well as the capacitors C11 and C12, and holds the maximum value of the divided voltage $V_{DIV}$ input by the negative feedback effect in the capacitors C11 and C12. By using such a configuration, the accuracy of the output detection voltage $V_{PH}$ is improved compared to a peak hold circuit made of, for example, a diode and a capacitor.

In the present embodiment, the detection circuit 16 includes the switches S11 and S12 for resetting the electric charges of the capacitors C11 and C12. The switches S11 and S12 are turned ON in every PWM cycle to reset the detection voltage $V_{PH}$ in every PWM cycle. In instances where a peak hold circuit does not have the switches S11 and S12 there may be situations where the surge voltage may continue to rise and the detection voltage $V_{PH}$ (i.e., the peak surge voltage) can be output. However, in instances where the peak hold circuit does not have the switches S11 and S12, there may also be instances where the surge voltage rises and falls, and the detection voltage $V_{PH}$ corresponding to the falling surge voltage cannot be output.

The surge voltage generated when the switching element 6 is turned OFF may change depending not only on the drive capacity of the driver 9 but also on the load current flowing in the switching element 6 and the load, or on the fluctuation of the power supply voltage. That means the surge voltage may fall during the drive capacity optimization of the driver 9 by the drive capacity calculator 11.

If the detection voltage $V_{PH}$ provided to the drive capacity calculator 11 does not reflect a fall of the surge voltage, the drive capacity may be not optimized. On the other hand, with the detection circuit 16 of the present embodiment, even when the surge voltage decreases/falls in such manner, the detection voltage $V_{PH}$ is reset in every PWM cycle, thereby enabling a correct and accurate reflection of the surge voltage fall in the output of the detection voltage $V_{PH}$. As such, with the present embodiment, the drive capacity can be optimized even when the surge voltage falls.

The drive capacity calculator 11 calculates the voltage deviation value ΔV in every PWM cycle, and changes the drive capacity of the driver 9 in one PWM cycle based on the voltage deviation value ΔV calculated in the previous PWM cycle (i.e., calculates the capacity change in the current nth cycle based on the deviation calculation ΔV in the previous (n−1)th cycle). In such manner, the drive capacity when the driver 9 is turned OFF can be quickly optimized. The quick optimization of the drive capacity can reduce the effects of switching losses in the switching element 6.

Second Embodiment

The second embodiment of the present disclosure is described with reference to FIGS. 5 and 6. When the switching element is driven with a predetermined drive capacity, if the load current changes, the surge voltage also changes based on the change of the load current. More specifically, if the drive capacity, that is, the resistance value of the gate resistor R2, is constant, the peak of the surge voltage rises as the load current increases, and the peak of the surge voltage decreases as the load current decreases.

When the surge voltage rises in instances where the drive capacity is optimized, a voltage exceeding a breakdown voltage of the switching element 24 may be applied to the main terminal of the switching element 24. For example, as shown in FIG. 5, when the load current is 50 A and the load current changes to 75 A in a state where the drive capacity is optimized, the peak surge voltage can exceed the breakdown voltage of the switching element 24.

When the surge voltage is lowered when the drive capacity is optimized, the drive capacity is needlessly lowered, and the switching loss in the switching element 24 increases in proportion to the lowered drive capacity. For example, as shown in FIG. 5, when the drive capacity is optimized and the load current drops from 50 A to 25 A, the peak surge voltage is lower than the switching element breakdown voltage, which negates the reductions in the switching losses of the switching element 24.

In the present embodiment, a gate drive circuit 21 can use counter measures to address the problems caused by changes in the load current. As shown in FIG. 6, the gate drive circuit 21 of the present embodiment is different from the gate drive circuit 1 of the first embodiment, because the gate drive circuit 21 includes a current detector 22 and a drive capacity calculator 23 in place of the drive capacity calculator 11, among other differences. A switching element 24 driven by the gate drive circuit 21 includes a main cell (not shown) disposed on a main power supply path and a sense cell (not shown) in which an electric current flows at a predetermined division ratio.

Each of the main cell and the sense cell of the switching element 24 are connected to an input node of the current detector 22. The current detector 22 detects a load current flowing in the switching element 24 based on the current flowing in the sense cell of the switching element 24. The current detector 22 outputs a detection signal Si representing a detection value. The detection signal Si is output to a controller 25 in the drive capacity calculator 23. The current detector 22, for example, may be realized as an integrated circuit configured to detect a current and output a signal corresponding to the detected current.

The drive capacity calculator 23 performs a control function similar to that of the drive capacity calculator 11 of the first embodiment, in addition to adjusting the drive capacity based on the detection value of the load current. The detection value of the load current is represented by the detection signal Si. The drive capacity calculator 23 first stores the drive capacity of the driver 9 that is set in the previous PWM cycle, the detected peak surge voltage in the previous PWM cycle, and the detected load current in the previous PWM cycle. In the present embodiment, the drive capacity of the driver is the resistance value of the gate resistor R2.

Then, the drive capacity computing unit 23 adjusts the drive capacity of the driver 9 based on the detection value of the load current immediately before the driver 9 is turned OFF in the next PWM cycle. For example, as shown in FIG. 5, when the load current is 50 A and the drive capacity is optimized in such state, if the detection value of the load current is 75 A immediately before the driver 9 is turned OFF in the next PWM cycle, continuing the drive as is, i.e., in the same state, leads to a situation with excessive voltage. In this instance, the excessive voltage exceeds the breakdown voltage and it is possible that the excessive voltage may be applied to the main terminal of the switching element 24.

In such a case, the drive capacity calculator 23 adjusts the drive capacity of the driver 9 so as to increase the resistance value of the gate resistor R2 in the next PWM cycle. More specifically, as indicated by the arrow A21 in FIG. 5, the drive capacity calculator 23 adjusts the drive capacity of the driver 9 so as to change the resistance value of the gate resistor R2 from a value Rb to a value Rc. In this example, the value Rb may be an optimum value (i.e., optimum value Rb) when the load current is 50 A, and the value Rc may be an optimum value (i.e., optimum value Rc) when the load current is 75 A. In such manner, in the next PWM cycle, the peak surge voltage is adjusted to bring the peak surge voltage to a value just below the breakdown voltage.

Figure 5:
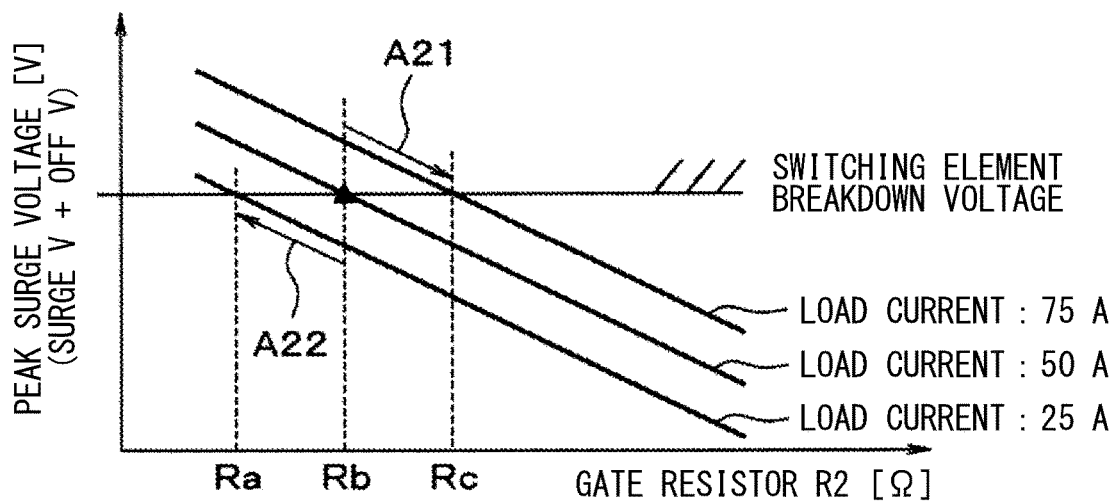
FIG. 5 illustrates a relationship between a gate resistance and a peak surge voltage for three load currents.
Figure 6:
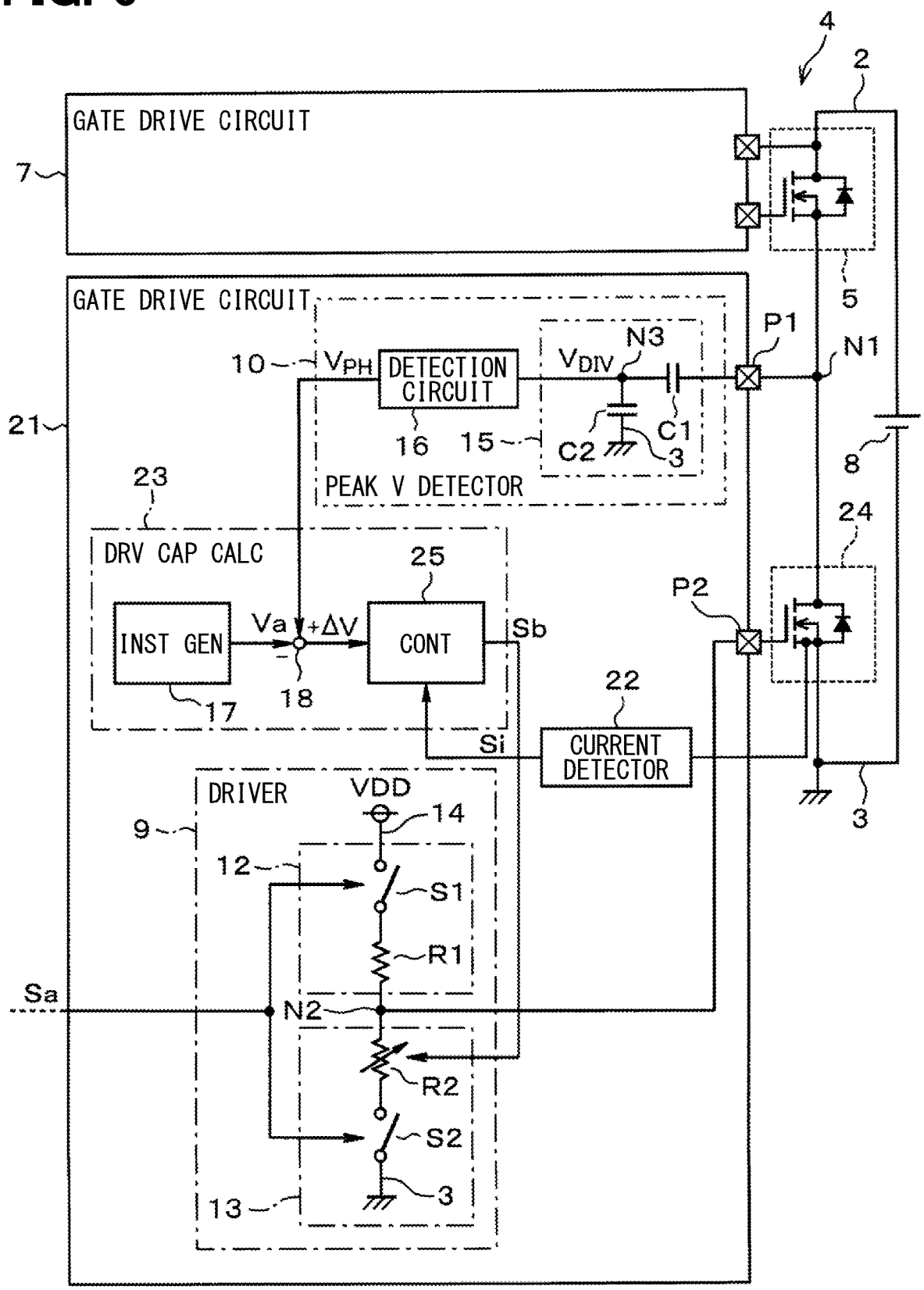
FIG. 6 is a gate drive circuit schematic in a second embodiment of the present disclosure.

As shown in FIG. 5, in the state where the drive capacity is optimized when the load current is 50 A, if the detection value of the load current is 25 A immediately before the driver 9 is turned OFF in the next PWM cycle, continuing the drive as is, i.e., in the same state, leads to a situation where the peak surge voltage is lower than the element breakdown voltage by a large amount.

In such a case, the drive capacity calculator 23 adjusts the drive capacity of the driver 9 so as to lower the resistance value of the gate resistor R2 in the next PWM cycle. More specifically, as indicated by the arrow A22 in FIG. 5, the drive capacity calculator 23 adjusts the drive capacity of the driver 9 so as to change the resistance value of the gate resistor R2 from a value Rb to a value Ra. In this example, the value Rb may be an optimum value when the load current is 50 A, and the value Ra may be an optimum value when the load current is 25 A. In such manner, in the next PWM cycle, the peak surge voltage is adjusted to bring the peak surge voltage to a value just below the breakdown voltage.

As described above, the drive capacity calculator 23 included in the gate drive circuit 21 in the present embodiment adjusts the change amount of the drive capacity based on the detection value of the load current detected by the current detector 22. As a result, even when the load current changes, the drive capacity of the driver 9 can be optimized by taking the current change into consideration. Consequently, the gate drive circuit 21 of the present embodiment can reduce the switching loss in the in the switching element 24 and control the surge voltage, regardless of the changes in the load current.

The drive capacity calculator 23 adjusts the drive capacity of the driver 9 based on the detection value of the load current immediately before the driver 9 is turned OFF in the next PWM cycle. As such, even when the load current changes, instances where the peak surge voltage exceeds the breakdown voltage or falls significantly below the breakdown voltage are both limited and/or completely eliminated, thereby optimizing the drive capacity of the driver 9 by considering the changes to the load current.

The current detector 22 is configured to detect the load current based on the electric current flowing in the sense cell of the switching element 24. With such a configuration, even when there is a relatively large current flowing through the main cell of the switching element 24, that is, flowing in the main current supply path, the current detection can still be easily performed.

The adjustment method performed by the drive capacity calculator 23 for adjusting the drive capacity of the driver 9 can be modified. For example, when the detection value of the load current is equal to or less than a predetermined lower limit determination value, the drive capacity calculator 23 can fix (i.e., set) the drive capacity of the driver 9 to the maximum capacity. In this example modification, the lower limit determination value can be set to a value that limits and/or prevents the peak surge voltage from exceeding the breakdown voltage even when the drive capacity of the driver 9 is maximized. Then, the drive capacity calculator 23 adjusts the drive capacity of the driver 9 based on the detection value of the load current when the detection value of the load current exceeds the lower limit determination value.

With such a modification, when the load current flowing in the switching element 24 is equal to or less than the lower limit determination value (i.e., a set value), the drive capacity of the driver 9 is quickly fixed to the maximum capacity. In such a case, the drive capacity of the driver 9 is maximized and the peak surge voltage does not exceed the breakdown voltage. That is, when the load current is equal to or less than the lower limit determination value, the drive capacity of the driver 9 is immediately optimized. As such, with the above modification, the time for adjusting the drive capacity can be shortened relative to adjustment methods that adjust the drive capacity without using a set value and based on the detection value of the load current alone.

Third Embodiment

The third embodiment of the present disclosure is described with reference to FIGS. 7 and 8. When the switching element 6 is driven with a predetermined drive capacity, if the power supply voltage changes, the surge voltage also changes based on the change of the power supply voltage. More specifically, if the drive capacity (i.e., the resistance value of the gate resistor R2) is constant, the peak of the surge voltage increases as the power supply voltage increases, and the peak of the surge voltage decreases as the power supply voltage decreases. The power supply voltage is a voltage of the DC power supply 8, and corresponds to the drain-source voltage $V_{DS}$ of the switching element 6 during the period when the switching element 6 is turned OFF. In the present embodiment, the power supply voltage may also be referred to as an OFF voltage.

When the surge voltage rises in instances where the drive capacity is optimized, a voltage exceeding a breakdown voltage may be applied to the main terminal of the switching element 6. For example, as shown in FIG. 7, in instances where the OFF voltage is changed to 600 V when the drive capacity is optimized for the OFF voltage of 500 V, the peak surge voltage exceeds the breakdown voltage.

When the surge voltage decreases in instances where the drive capacity is optimized, the drive capacity is needlessly lowered and the switching loss in the switching element 6 increases proportionately. For example, as shown in FIG. 7, in instances where the OFF voltage is changed to 400 V when the drive capacity is optimized for the OFF voltage of 500 V, the peak of the surge voltage is lower than the breakdown voltage. As such, the switching loss reduction in the switching element 6 by the optimization of the drive capacity is negated.

In the present embodiment, a gate drive circuit 31 can use counter measures to address the problems caused by changes in the OFF voltage. As shown in FIG. 8, the gate drive circuit 31 of the present embodiment is different from the gate drive circuit 1 of the first embodiment, because the gate drive circuit 31 includes an OFF voltage detector 32 and a drive capacity calculator 33 in place of the drive capacity calculator 11, among other differences. The OFF voltage detector 32 may also be referred to as a peak voltage detector 32 or more simply as a voltage detector 32.

An input of the OFF voltage detector 32 is connected to the node N3 of the voltage divider 15 in the peak voltage detector 10. The voltage divider 15 outputs a divided voltage $V_{DIV}$ to the OFF voltage detector 32. The OFF voltage detector 32 detects an OFF voltage based on a divided voltage $V_{DIV}$ and outputs a detection signal Sv that represents the detected OFF voltage. The OFF voltage detector 32 outputs the detection signal Sv to a controller 34 in the drive capacity calculator 33. The voltage detector 32, for example, may be realized as an integrated circuit configured to detect a voltage and output a signal corresponding to the detected voltage.

The drive capacity calculator 33 performs a control function similar to that of the drive capacity calculator 11 of the first embodiment, in addition to adjusting the drive capacity based on the detection value of the OFF voltage (i.e., based on the detection signal Sv). The drive capacity calculator 33 stores the drive capacity of the driver 9 that is set in the previous PWM cycle, the detected peak surge voltage in the previous PWM cycle, and the detected load current in the previous PWM cycle. In the present embodiment, the drive capacity of the driver 9 is the resistance value of the gate resistor R2.

Then, the drive capacity calculator 33 adjusts the drive capacity of the driver 9 based on the detection value of the OFF voltage. For example, as shown in FIG. 7, when the OFF voltage is 500 V and the drive capacity is optimized, if the detection value of the OFF voltage is changed to 600 V, the 600 V voltage may exceed the breakdown voltage. In this instance, it is possible that the 600 V OFF voltage may be applied to the main terminal of the switching element 6.

In such a case, the drive capacity calculator 33 adjusts the drive capacity of the driver 9 so as to increase the resistance value of the gate resistor R2. More specifically, as indicated by an arrow A31 in FIG. 7, the drive capacity calculator 33 adjusts the drive capacity of the driver 9 so as to change the resistance value of the gate resistor R2 from a Re to a value Rf. The resistance value Re is the optimum resistance value when the OFF voltage is 500 V and the resistance value Rf is the optimum value when the OFF voltage is 600 V. In such manner, even with a change to the OFF voltage, the peak surge voltage can be adjusted to bring the peak surge voltage to a value just below the breakdown voltage.

Figure 7:
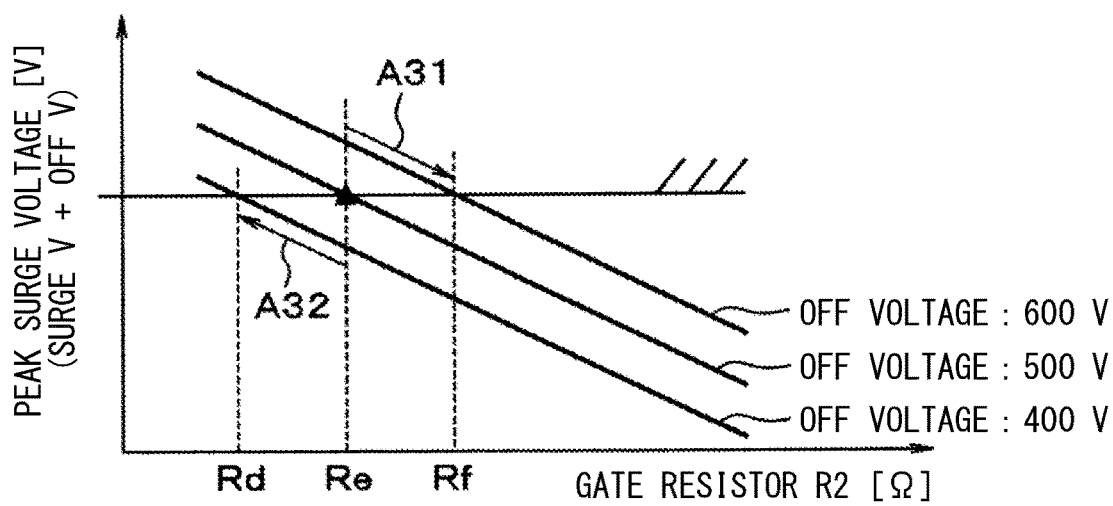
FIG. 7 illustrates a relationship between a gate resistance and a peak of surge voltage for three power supply voltages in a third embodiment of the present disclosure.
Figure 8:
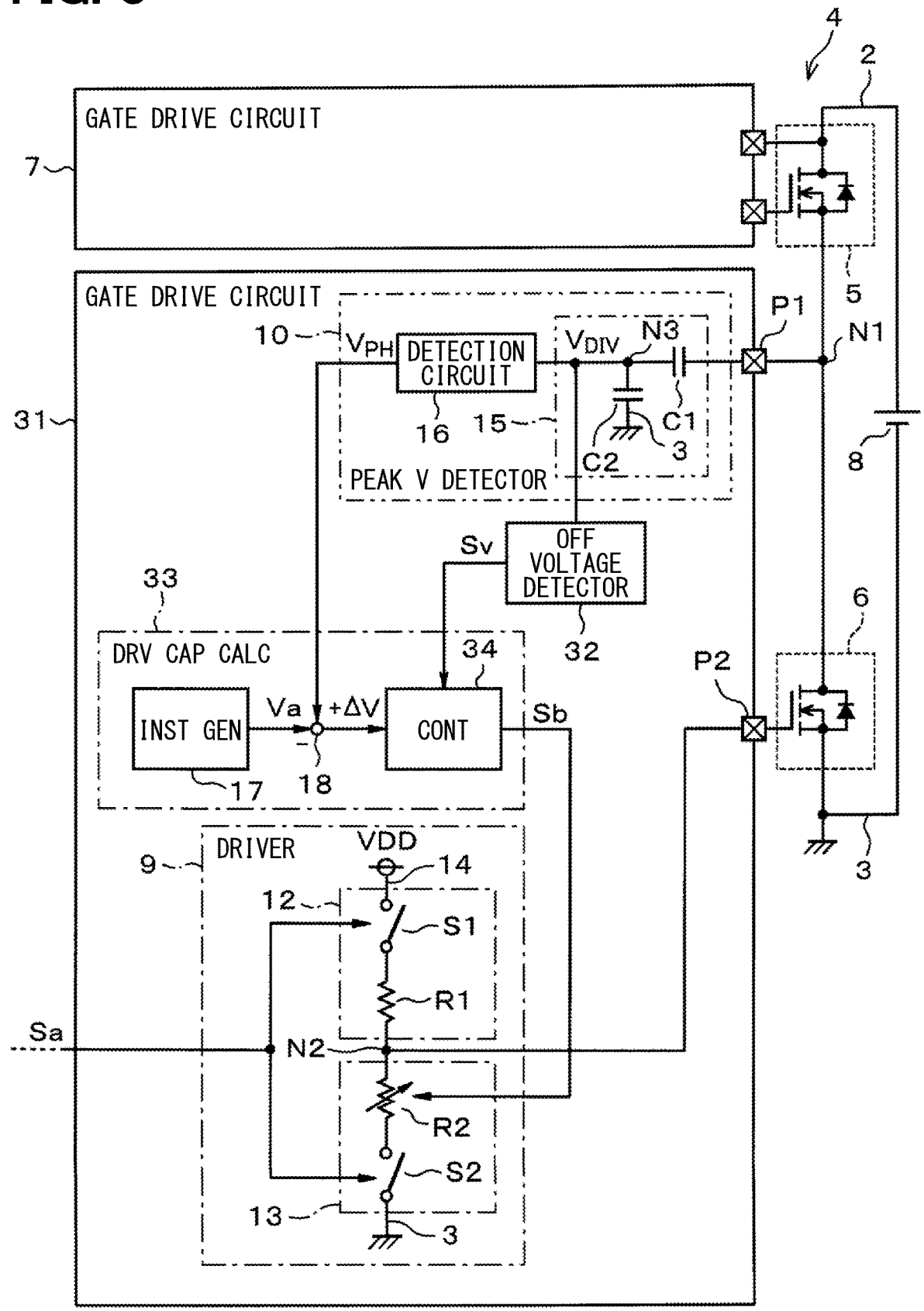
FIG. 8 illustrates a gate drive circuit schematic in the third embodiment.

As shown in FIG. 7, when the drive capacity is optimized for the OFF voltage of 500 V and the OFF voltage changes to 400 V, the peak surge voltage may fall to be significantly lower than the value of the breakdown voltage.

In such a case, the drive capacity calculator 33 adjusts the drive capacity of the driver 9 so as to lower the resistance value of the gate resistor R2. More specifically, as indicated by an arrow A32 in FIG. 7, the drive capacity calculator 33 adjusts the drive capacity of the driver 9 so as to change the resistance value of the gate resistor R2 from the resistance value Re to the resistance value Rd. The resistance value Re is the optimum resistance value when the OFF voltage is 500 V and resistance value Rd is the optimum resistance value when the OFF voltage is 400 V. In such manner, even with a change to the OFF voltage, the peak surge voltage can be adjusted to bring the peak surge voltage to a value just below the breakdown voltage.

As described above, the drive capacity calculator 33 included in the gate drive circuit 31 adjusts the drive capacity based on the detection value of the OFF voltage by the OFF voltage detector 32. As such, even when the OFF voltage changes, the gate drive circuit of the present embodiment can optimize the drive capacity of the driver 9 in consideration of the changed OFF voltage. As a result, the gate drive circuit 31 of the present embodiment can reduce the switching loss in the switching element 6 and suppress the surge voltage, regardless of the changes in the OFF voltage.

In such cases, the peak voltage detector 10 is configured to detect the peak voltage from the terminal P1 and the OFF voltage detector 32 is configured to detect the OFF voltage from the terminal P1. That is, the peak voltage detector 10 and the OFF voltage detector 32 make detections based on the voltage at terminal P1 that supplies voltage to the main terminal of the switching element 6. That is, the OFF voltage detector 32 shares the terminal P1 and the voltage divider 15 with the peak voltage detector 10. The configuration of the present embodiment can reduce the volume of the gate drive circuit 31 by having the OFF voltage detector 32 share the terminal P1 and the voltage divider with the peak voltage detector 10, instead of having a separate, dedicated voltage detection circuit for the OFF voltage detector 32.

The drive capacity adjustment by the drive capacity calculator 33 can be modified. That is, when the detection value of the OFF voltage is equal to or less than a predetermined lower limit determination value, the drive capacity calculator 33 fixes (i.e., sets) the drive capacity of the driver 9 to a maximum capacity. In this example, the lower limit determination value is set to an OFF voltage value such that the peak surge voltage does not exceed the breakdown voltage even when the drive capacity of the driver 9 is maximized. Then, when the detected OFF voltage value exceeds (e.g., falls below) the lower limit determination value, the drive capacity calculator 33 adjusts the drive capacity of the driving unit 9 based on the detection value of the OFF voltage.

With this example modification, when the OFF voltage is equal to or less than the lower limit determination value, the drive capacity of the driver 9 is quickly fixed to the maximum capacity. In such cases, the drive capacity of the driver 9 is maximized and the peak surge voltage does not exceed the breakdown voltage. That is, with the above modification, when the OFF voltage is equal to or less than the lower limit determination value, the drive capacity of the driver 9 is immediately optimized. As such, the time for adjusting the drive capacity can be reduced compared to adjustment methods without the lower limit determination value where the drive capacity is adjusted based on the detection value of the OFF voltage alone. In other words, the example modification of the drive capacity adjustment by the driver 9 can reduce the time for optimizing the drive capacity of the driver 9.

Fourth Embodiment

Figure 9:
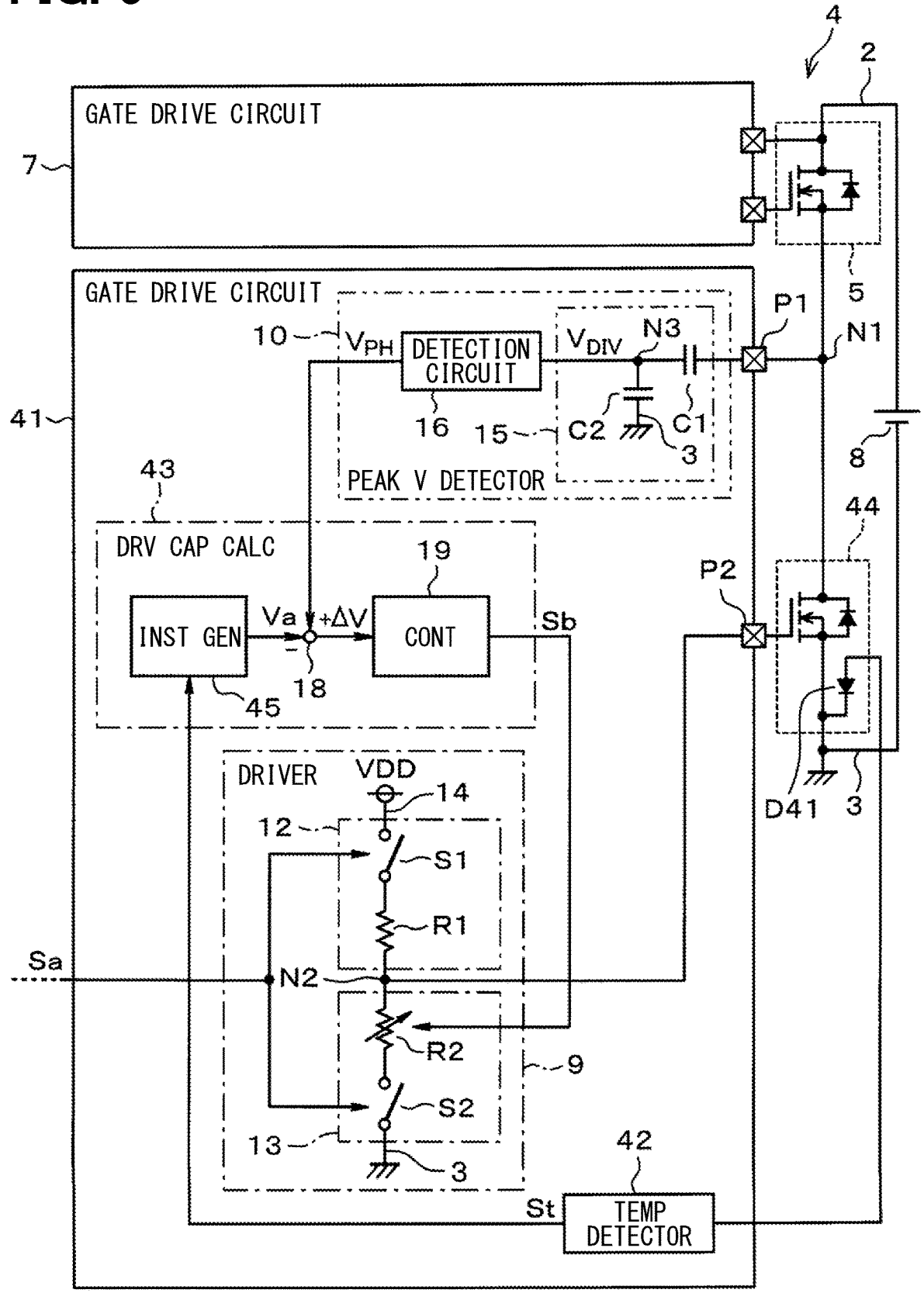
FIG. 9 illustrates a gate drive circuit schematic in a fourth embodiment of the present disclosure.

The fourth embodiment of the present disclosure is described with reference to FIG. 9. In principle, the breakdown voltage of a switching element 44 depends on the temperature of the switching element 44. More specifically, the breakdown voltage increases as the temperature of the switching element 44 increases, and the breakdown voltage decreases as the temperature of the switching element 44 decreases. As such, when the drive capacity is optimized and the temperature of the switching element 44 decreases, the peak surge voltage may exceed the breakdown voltage.

When the temperature of the switching elements 44 rises in instances where the drive capacity for the driver 9 is already optimized, the peak surge voltage can be significantly lower than the breakdown voltage. Such a lowering of the breakdown voltage when the driver is optimized may negate the switching loss reductions in the switching element 44 that are achieved when the drive capacity of the driver 9 is optimized.

In the present embodiment, a gate drive circuit 41 may use countermeasures to address the problems caused by the changes in the temperature of the switching element 44. As shown in FIG. 9, the gate drive circuit 41 of the present embodiment differs from the gate drive circuit 1 of the first embodiment in that the gate drive circuit 41 includes a temperature detector 42 and a drive capacity calculator 43 in place of the drive capacity calculator 11. The switching element 44 that is driven by the gate drive circuit 41 includes a diode D41. The diode D41 is a temperature sensitive diode.

An input of the temperature detector 42 is connected to the anode of the diode D41. The temperature detector 42 detects the temperature of the switching element 44 based on changes in the terminal voltage of the diode D41. The temperature detector 42 outputs a detection signal St that represents the detected value of the temperature of the switching element 44. The detection signal St is input to an instruction generator 45 in the drive capacity calculator 43. The temperature detector 42, for example, may be realized as an integrated circuit configured to detect a temperature and output a signal corresponding to the detected temperature.

In addition to performing a control function similar to that of the drive capacity calculator 11, the drive capacity calculator 43 adjusts the drive capacity of the driver 9 based on the detected temperature of the switching element 44 (i.e., based on the detection signal St). The drive capacity calculator 43 stores the drive capacity of the driver 9 set in the previous PWM cycle, the detected peak surge voltage value in the previous PWM cycle, and the detected temperature of the switching element 44 in the previous PWM cycle. In this embodiment, the drive capacity of the driver 9 is the resistance value of the gate resistor R2.

The drive capacity calculator 43 adjusts the drive capacity of the driver 9 based on the detected temperature of the switching element 44. For example, in instances where the drive capacity is optimized and the temperature of the switching element 44 drops, a voltage exceeding the breakdown voltage may be applied to the main terminal of the switching element 44. In such cases, the drive capacity calculator 43 changes the instruction voltage Va corresponding to the allowable surge voltage to have a lower voltage value. The instruction voltage Va is output from the instruction generator 45. In such manner, even after the temperature of the switching element 44 changes, the peak surge voltage can be adjusted to bring the peak surge voltage to a value just below the breakdown voltage.

In instances where the drive capacity is optimized and the temperature of the switching element 44 increases, the peak surge voltage may fall to be significantly lower than the breakdown voltage. In such cases, the drive capacity calculator 43 changes the instruction voltage Va to have a higher voltage value and the instruction voltage Va is output from the instruction generator 45. In such manner, even after the temperature of the switching element 44 changes, the peak surge voltage can be adjusted to just below the breakdown voltage.

In the gate drive circuit 41 of the present embodiment, the drive capacity calculator 43 adjusts the drive capacity based on the detected temperature of the switching element 44 so that even when the temperature of the switching element 44 changes, the drive capacity of the driver 9 can be optimized taking the changing temperature of the switching element 44 into account. As such, the gate drive circuit 41 of the present embodiment can reduce the switching losses in the switching element 44 while controlling the surge voltage, regardless of changes in the temperature of the switching element 44.

Fifth Embodiment

The fifth embodiment of the present disclosure is described with reference to FIG. 10. The gate drive circuits 21, 31, and 41 respectively described in the second, third and fourth embodiments can be combined with each other. The present embodiment describes a gate drive circuit 51 that includes elements from the gate drive circuits 21, 31, and 41 described in the previous embodiment.

Figure 10:
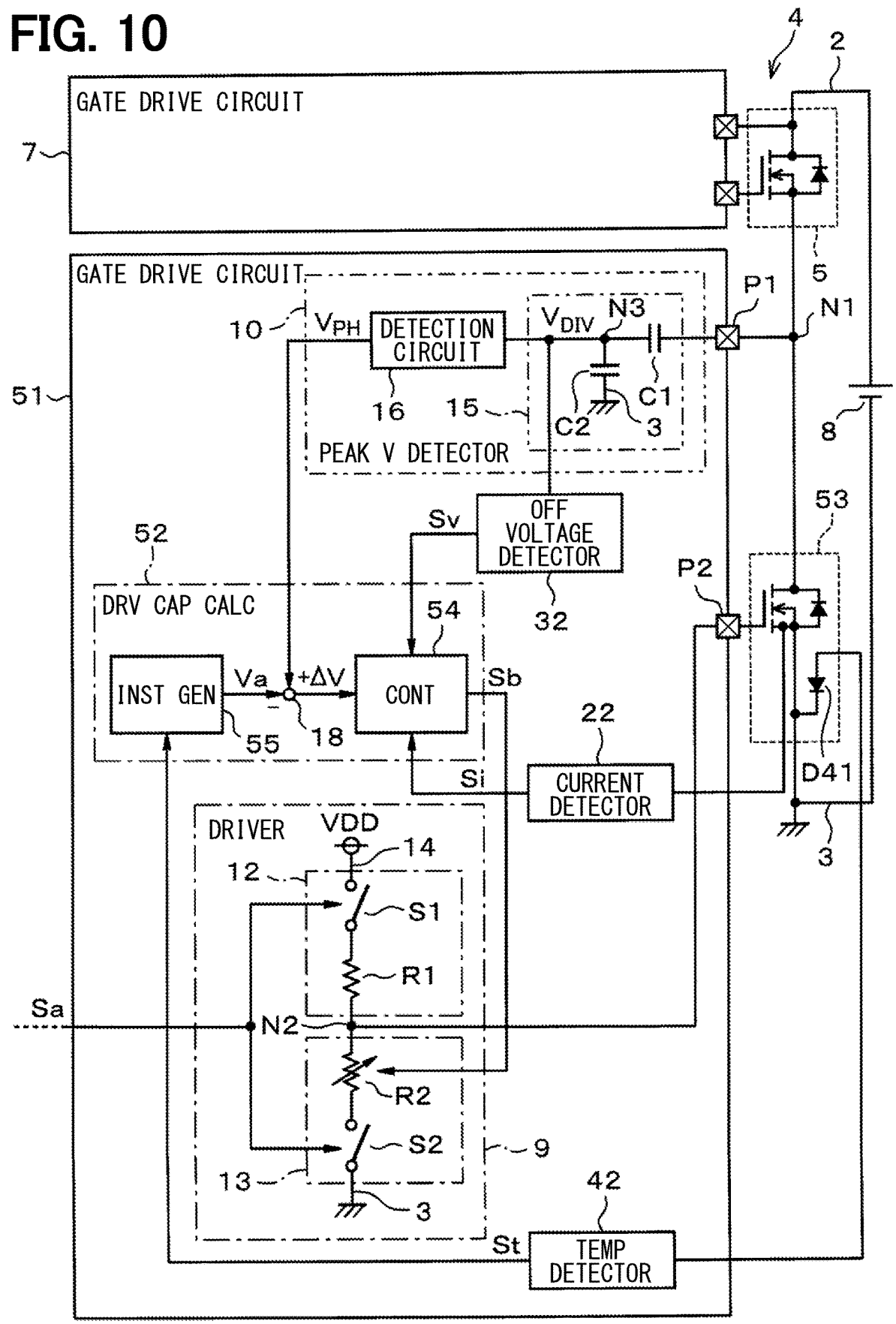
FIG. 10 illustrates a gate drive circuit schematic in a fifth embodiment of the present disclosure.

As shown in FIG. 10, the gate drive circuit 51 of the present embodiment differs from the gate drive circuit 1 of the first embodiment, because the gate drive circuit 51 includes the current detector 22 of the second embodiment, the OFF voltage detector 32 of the third embodiment, the temperature detector 42 of the fourth embodiment, and a drive capacity calculator 52 in place of the drive capacity calculator 11 of the first embodiment. A switching element 53 that is driven by the gate drive circuit 51 includes a main cell and a sense cell like the switching element 24 of the second embodiment. The switching element 53 is also similar to the switching element 44 of the fourth embodiment in that it also includes the diode D41.

The detection signal Si output from the current detector 22 and the detection signal Sv output from the OFF voltage detector 32 are input to a controller 54 in the drive capacity calculator 52. The detection signal St output from the temperature detector 42 is input to an instruction generator 55 in the drive capacity calculator 52. The drive capacity calculator 52 is configured to adjust the drive capacity based on the detection value of the load current (i.e., from the signal Si), the detection value of the OFF voltage (i.e., from the signal Sv), and the detected temperature value of the switching element 53 (i.e., from the signal St).

As described above, the drive capacity calculator 52 in the gate drive circuit 51 adjusts the drive capacity based on the detection values of the load current, the OFF voltage, and the temperature of the switching element 53. In the gate drive circuit 51 of the present embodiment, the drive capacity of the driver 9 can be optimized even when there are changes in any of the load current, the OFF voltage, or the temperature of the switching element 53. As such, the gate drive circuit 51 of the present embodiment can reduce the switching losses in the switching element 53 while controlling the surge voltage, regardless of the changes in any of the load current, the OFF voltage, and the temperature of the switching element 53.

Sixth Embodiment

The sixth embodiment of the present disclosure is described with reference to FIGS. 11 and 12.

Figure 11:
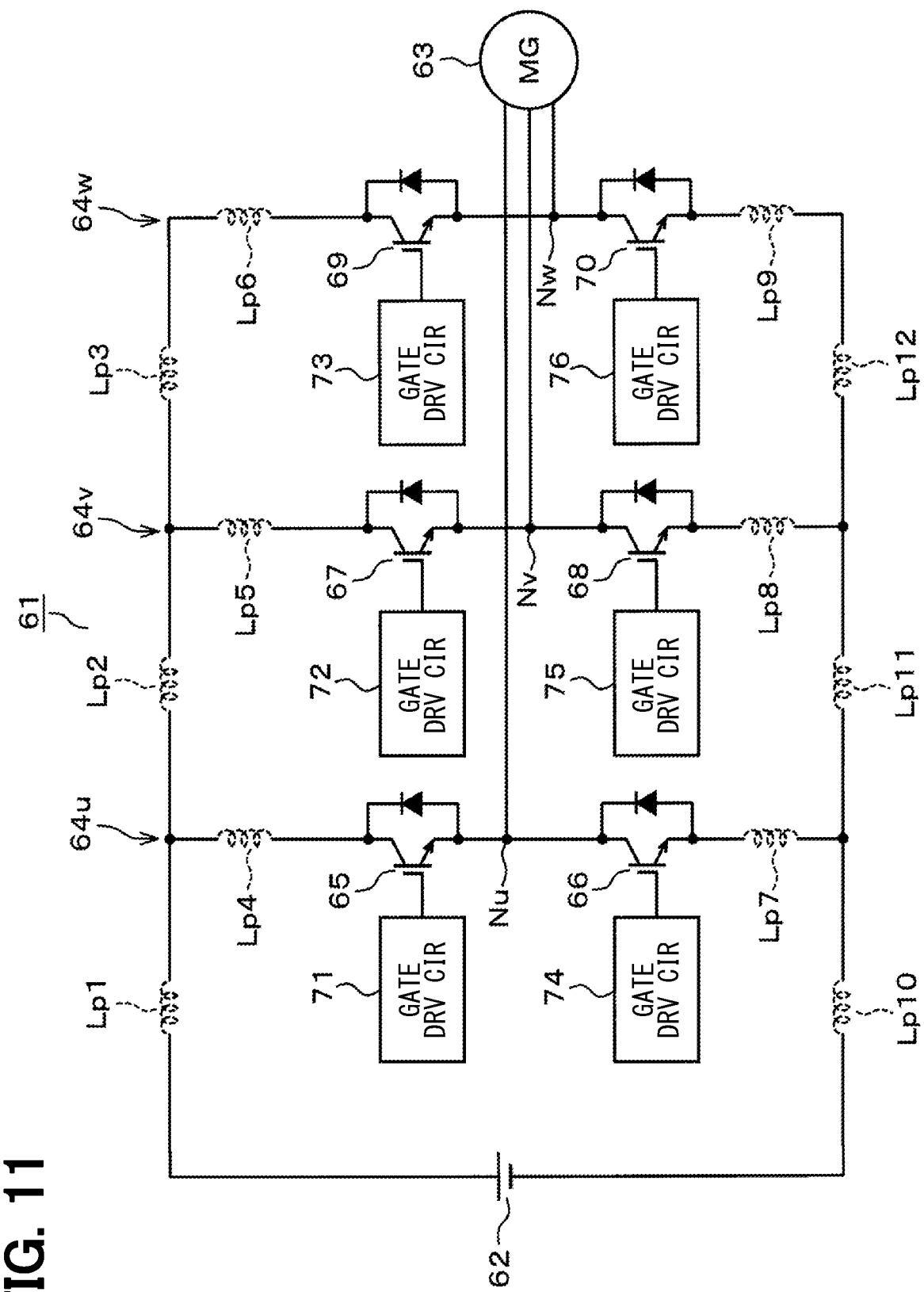
FIG. 11 illustrates a three-phase inverter schematic in a sixth embodiment of the present disclosure.

FIG. 11 illustrates an inverter 61 that converts a DC voltage to a three-phase alternating current (AC) voltage. The inverter 61 converts the DC voltage to an AC voltage with a U phase, a V phase, and a W phase, and outputs the AC voltage to a motor generator 63. As such, the inverter 61 may also be referred to as a three-phase inverter 61. The inverter 61 respectively includes three half-bridge circuits 64u, 64v, and 64w for each of the U phase, the V phase, and the W phase.

The half-bridge circuit 64u includes switching elements 65 and 66 that are, for example, insulated-gate bipolar transistors (IGBTs). An interconnection node Nu of the switching elements 65 and 66 is connected to a U phase terminal of the motor generator 63 and the node Nu is a U phase output terminal of the three-phase inverter 61.

The half-bridge circuit 64v includes switching elements 67 and 68 that are, for example, IGBTs. An interconnection node Nv of the switching elements 67 and 68 is connected to a V phase terminal of the motor generator 63 and the node Nv is a V phase output terminal of the three phase inverter 61.

The half-bridge circuit 64w includes switching elements 69 and 70 that are, for example, IGBTs. An interconnection node Nw of the switching elements 69 and 70 is connected to a W phase terminal of the motor generator 63 and the node Nw is a W phase output terminal of the three phase inverter 61.

In FIG. 11, inductors Lp1, Lp2, Lp3, Lp4, Lp5, Lp6, Lp7, Lp8, Lp9, Lp10, Lp11, and Lp12 (i.e., inductors Lp1-Lp12) are illustrated by broken lines to indicate that the inductors Lp1-Lp12 are parasitic inductors in the circuit pathways (i.e., wiring paths) from the DC power supply 62 to the respective switching elements 65, 66, 67, 68, 69, and 70 (i.e., switching elements 65-70).

The gate drive circuits 71, 72, and 73 respectively drive the switching elements 65, 67, and 69 on the high side, and the gate drive circuits 74, 75, and 76 respectively drive the switching elements 66, 68, and 70 on the low side.

The basic configuration for each of the gate drive circuits 71-76 is the same. That is, the configuration for one of the gate drive circuits (e.g., the gate drive circuit 71) may be adopted for the other gate drive circuits (e.g., the gate drive circuits 72-76). In the present embodiment, for example, the configuration of the gate drive circuit 1 in the first embodiment may be used as the configuration of the gate drive circuits 71-76.

In the present embodiment, the concept of allowable surge voltage differs from the allowable surge voltage descriptions in the prior embodiments. The concept of allowable surge voltage may be considered for each of the gate drive circuits 71-76 in the present embodiment. That is, in the inverter 61, the switching elements 65-70 in one phase (i.e., the subject phase) may be prone to receiving one or more surge voltages generated in the other phases that may possibly overlap with the surge voltage of the subject phase. The surge voltages in the other phases may be influenced by the parasitic inductors Lp1-Lp12 in the other phases depending on the ON and OFF times of the surge voltages. In this example, the surge voltage generated in a subject phase is referred to as a subject phase surge voltage, and the surge voltage generated in another phase is referred to as the other phase surge voltage.

Figure 12:
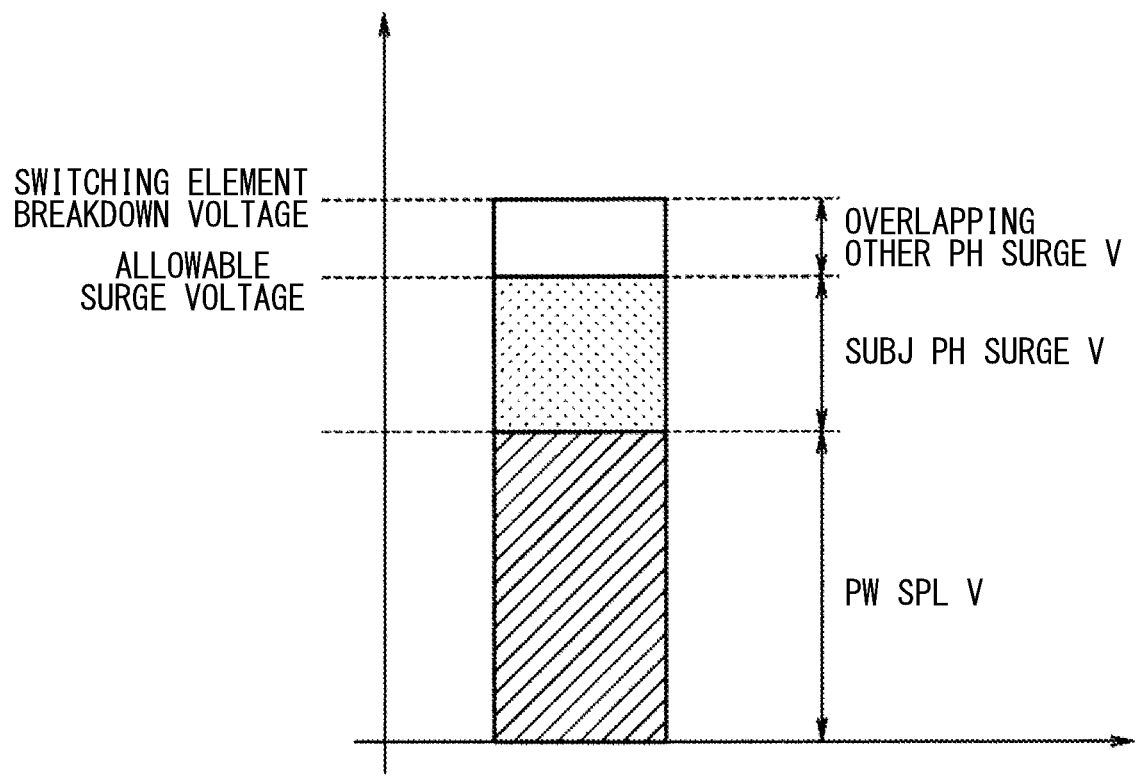
FIG. 12 illustrates an allowable surge voltage in the sixth embodiment.

As shown in FIG. 12, a peak surge voltage applied to a switching element 65-70 may be calculated by adding the other phase overlapping surge voltages. That is, a surge voltage applied to a switching element 65-70 may be the sum of: (i) the subject phase surge voltage, (ii) an overlapping other phase surge voltage, and (iii) the power supply voltage. In the present embodiment, a value of the allowable surge voltage, calculated in view of the peak surge voltage described above, is a sum of: (a) the presumable maximum value of the subject phase surge voltage, (b) the presumable maximum value of the other phase surge voltage, and (c) the value of the power supply voltage. The value of the allowable surge voltage is set to not exceed the breakdown voltage of each of the switching elements 65-70.

In such cases, since the effects of the parasitic inductors differ from phases to phase, the overlapping voltages of the other phase surge voltages are different for each of the switching elements 65-70. As such, the allowable surge voltage is individually determined for each of the switching elements 65-70. In the present embodiment, an instruction voltage Va is generated correspondingly based on an allowable surge voltage determined in such manner.

As described above, the gate drive circuits 71-76 in the present embodiment drive the switching elements 65-70 that make up the inverter 61, and the allowable surge voltage includes not only the subject-phase surge voltage but also the overlapping other-phase surge voltage(s). The inverter 61 of the present embodiment can limit and/or prevent voltages exceeding a breakdown voltage from being applied to a circuit/position between the main terminals (i.e., between the collector and the emitter) of each of the switching elements 65-70.

Seventh Embodiment

The gate drive circuits 71-76 in the sixth embodiment generate the allowable surge voltage, and hence the instruction voltage Va, by taking the maximum value of the overlapping, other-phase surge voltage into consideration. However, in practice, the overlapping voltage of the other-phase surge voltage does not necessarily take the maximum value every time it occurs. In most cases, the overlapping voltage is lower than the maximum value. The method of setting the allowable surge voltage, as described in the sixth embodiment, may reserve too much margin. As such, the optimization of the drive capacity in the sixth embodiment may be further improved.

Figure 13:
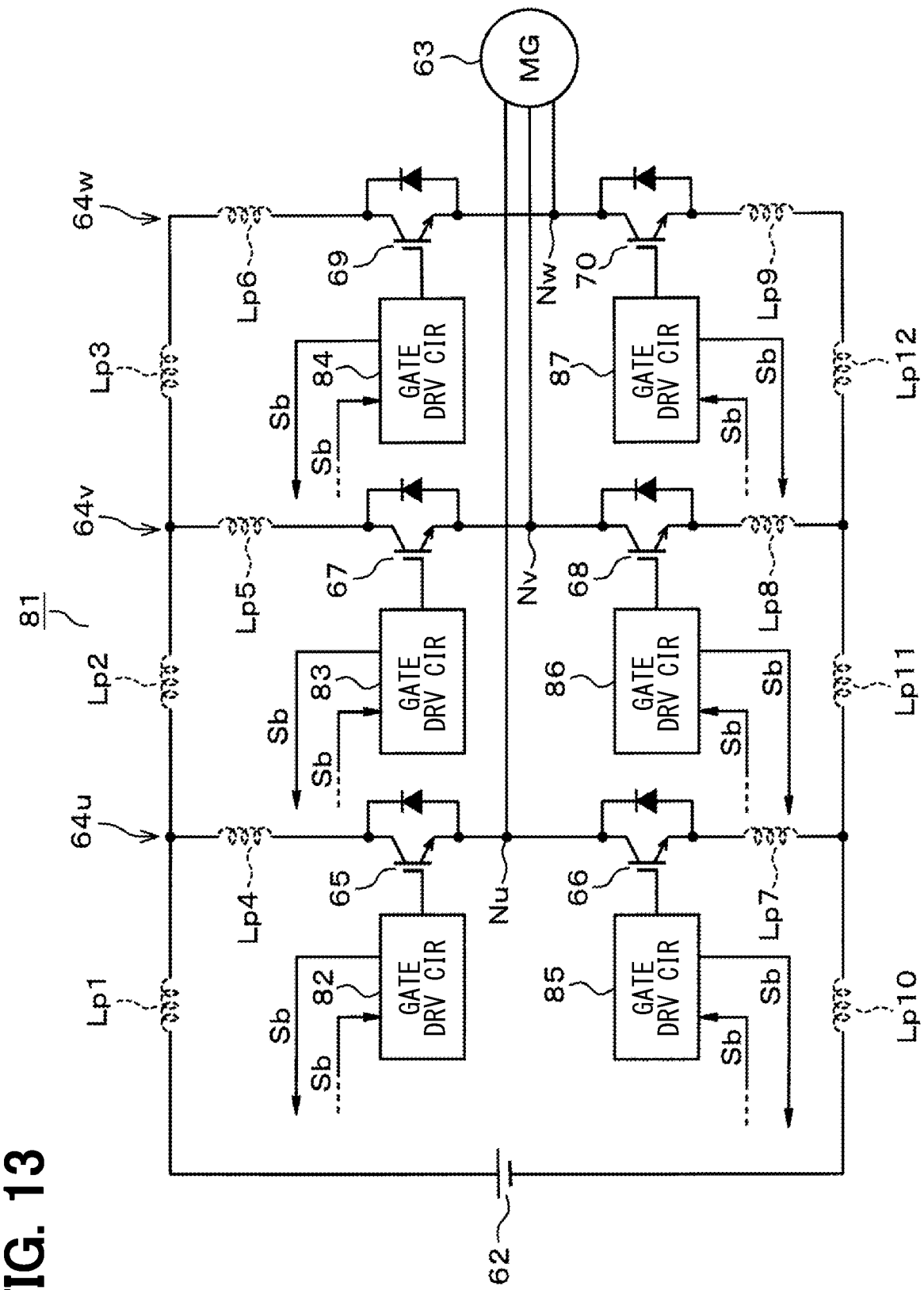
FIG. 13 illustrates a three-phase inverter schematic in a seventh embodiment of the present disclosure.

The seventh embodiment of the present disclosure is described with reference to FIG. 13. As shown in FIG. 13, the inverter 81 of the present embodiment includes gate drive circuits 82, 83, 84, 85, 86, and 87 (i.e., gate drive circuits 82-87) in place of the gate drive circuits 71-76 of the inverter 61 in the sixth embodiment. The gate drive circuits 82-87 in the present embodiment may be configured like any of the gate drive circuits (e.g., 11, 21, 31, 41, and 51) described in the previous embodiments and may refer to elements described in the previous embodiments. The gate drive circuits 82-87 are configured to communicate with each other to perform isolated communication. The gate drive circuits 82-87 can transmit their own capacity instruction signal Sb (e.g., the subject instruction signal Sb of the gate drive circuit 82) to other gate drive circuits (e.g., gate drive circuits 83-87), and receive a capacity instruction signal Sb from other gate drive circuits 82-87.

In such a case, the capacity instruction signal Sb corresponds to drive capacity information related to the drive capacity of the driver set in the gate drive circuit. The gate drive circuits 82-87 include the instruction generator 17 of the drive capacity calculator 11. An instruction generator 17 in one of the gate drive circuits 82-87 generates the instruction voltage Va corresponding to the allowable value based on the capacity instruction signal(s) Sb transmitted from the other gate drive circuit(s).

More specifically, based on the capacity instruction signal(s) Sb transmitted from the other gate drive circuit(s), the instruction generator 17 estimates the current drive condition(s) of the other gate drive circuit(s), and hence the magnitude of the other-phase surge voltage(s). Then, the instruction generator 17 generates the allowable surge voltage, that is, the instruction voltage Va by taking the magnitude of the other-phase surge voltage(s) estimated as described above into consideration.

As described above, the instruction generator 17 of the drive capacity calculator 11 included in the gate drive circuits 82-87 in the present embodiment obtains the capacity instruction signal Sb corresponding to the drive capacity information of the drivers 9 set in the other gate drive circuits 82-87 from other gate drive circuits 82-87. The instruction generator 17 then generates the allowable surge voltage, and hence the instruction voltage Va, based on the obtained capacity instruction signals Sb. The gate drive circuits 82-87 of the present embodiment will limit and/or avoid setting too much excessive margin while limiting and/or preventing voltages exceeding a breakdown voltage from being applied to a circuit/position between the main terminals (i.e., between the collector and the emitter) of each of the switching elements 65-70 even when the surge voltages of the other phases are overlapping. As such, the gate drive circuits 82-87 of the present embodiment can optimize the drive capacity of the drivers 9 in the gate drive circuits 82-87.

Eighth Embodiment

Figure 14:
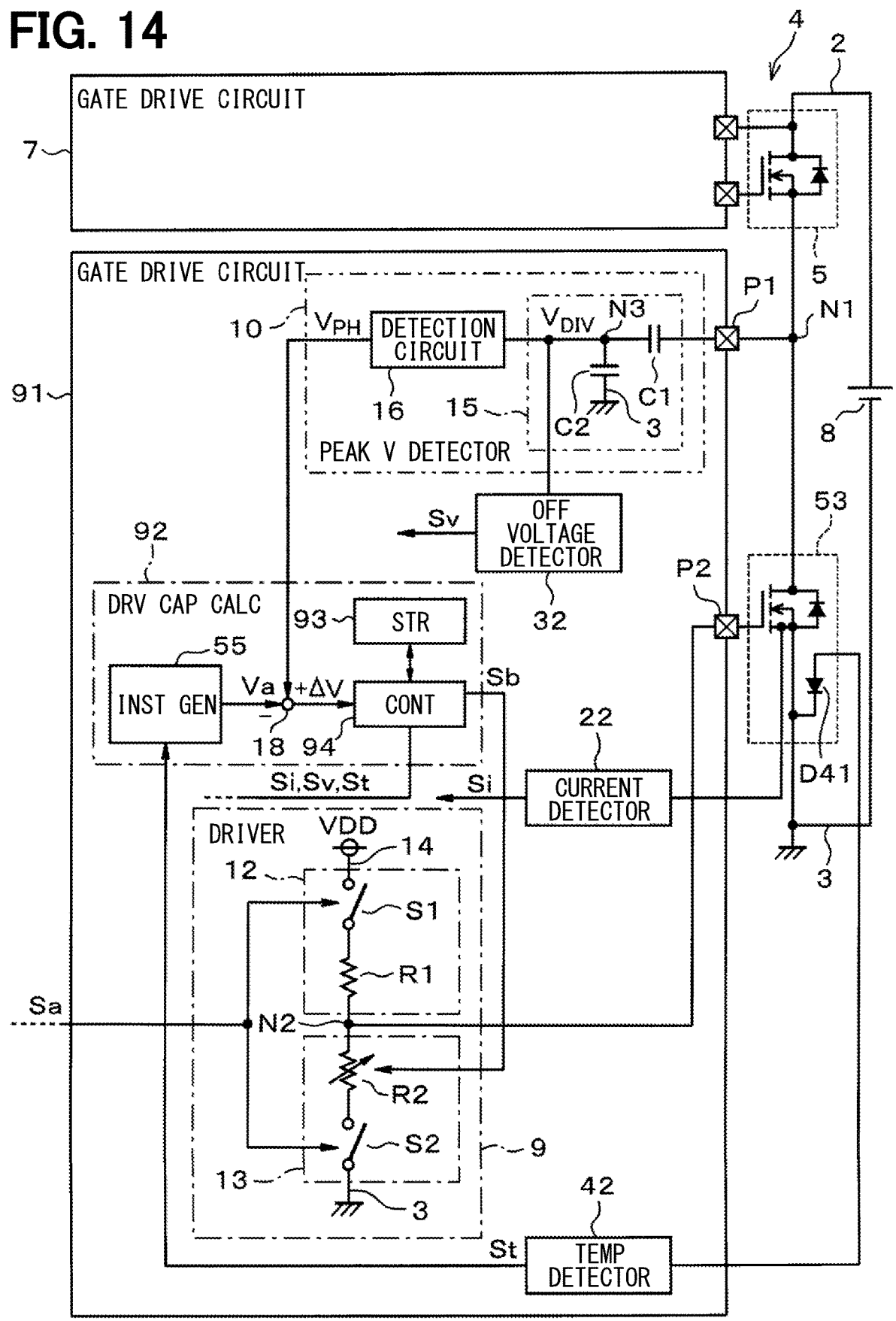
FIG. 14 illustrates a gate drive circuit schematic in an eighth embodiment of the present disclosure.

The eighth embodiment of the present disclosure is described with reference to FIG. 14. A gate drive circuit 91 shown in FIG. 14 is different than the gate drive circuit 51 in the fifth embodiment, because the gate drive circuit 91 includes a drive capacity calculator 92 in place of the drive capacity calculator 52. The drive capacity calculator 92 is different than the drive capacity calculator 52, because the drive capacity calculator 92 includes a storage 93 and a controller 94 in place of the controller 54. The storage 93 may be a memory 93 such as RAM, ROM, or flash memory.

The storage 93 stores a map that associates: (i) the load current flowing in the switching element 53; (ii) the OFF voltage that corresponds to the drain-source voltage $V_{DS}$ of the switching element 53 when the switching element 53 is OFF; and (iii) the temperature of the switching element 53 with the optimum value of the drive capacity of the driver 9. That is, the map in the storage 93 associates the load current of the switching element 53, the drain-source voltage $V_{DS}$ of the switching element 53 when the switching elements 53 is OFF, and the temperature of the switching element with the optimum resistance value of the gate resistor R2. Such a map may be created in advance and stored in the memory 93.

In such a case, (i) the detection signal Si output from the current detector 22, (ii) the detection signal Sv output from the OFF voltage detector 32, and (iii) the detection signal St output from the temperature detector 42 are all input to the controller 94. The detection signal St is also input to the instruction generator 55 just like in the fifth embodiment. The controller 94 determines the drive capacity of the driver 9 based on (i) the detection value of the load current represented by the detection signal Si, (ii) the detection value of the OFF voltage represented by the detection signal Sv, (iii) the detection value of the temperature represented by the detection signal St, and also based on (iv) the contents of the map stored in the storage 93. The controller 94 then generates the capacity setting signal Sb based on the drive capacity determined by the controller 94, and outputs the generated signal Sb to the driver 9.

The controller 94 updates the map stored in the storage 93 based on the voltage deviation value ΔV. The voltage deviation value ΔV is the difference between the detection value of the peak surge voltage and the instruction value. More specifically, the controller 94 updates the contents of the map stored in the storage 93 so that the voltage deviation value ΔV gradually becomes smaller.

As described above, the drive capacity calculator 92 in the gate drive circuit 91 of the present embodiment sets the drive capacity of the driver 9 by performing a map control. Even with such a configuration, the surge voltage can be suppressed without increasing the switching losses in the switching element 53, similar to the advantageous effects achieved by the prior embodiments.

However, it may be difficult to set and store an initial map in advance to the storage 93, where such a map takes the variations of the circuit elements into consideration. Based on the initial setting of the drive capacity from using the initial map, the drive capacity may be not optimizable. If the drive capacity is not optimum, the voltage deviation value ΔV does not decrease to a desired value.

As such, the controller 94 of the drive capacity calculator 92 in the present embodiment updates the map stored in the storage 93 so that the voltage deviation value ΔV becomes gradually smaller. Then, the controller 94 determines the drive capacity based on the map updated in the above-described manner. In such manner, the drive capacity can be optimized by taking the variations of the circuit elements into account.

The map stored in the storage 93 may be any map so long as the map associates at least one of the load current, the OFF voltage, and the temperature of the switching element 53 with the optimum value of the drive capacity of the driver 9. The gate drive circuit 91 does not have to include each of the current detector 22, the OFF voltage detector 32, and the temperature detector 42.

For example, when the map stored in the storage 93 associates only one of the load current, the OFF voltage, and the temperature with the optimum value of the drive capacity, the gate drive circuit 91 may be configured to include only one of the current detector 22, the OFF voltage detector 32, and the temperature detector 42. When the map stored in the storage 93 is the one which associates two of the load current, the OFF voltage and the temperature with the optimum value of the drive capacity, the gate drive circuit 91 may be configured to include two of the current detector 22, the OFF voltage detector 32, and the temperature detector 42.

FIG. 15—INTRODUCTION (CAPACITORS SEPARATE BODIES)

Figure 15:
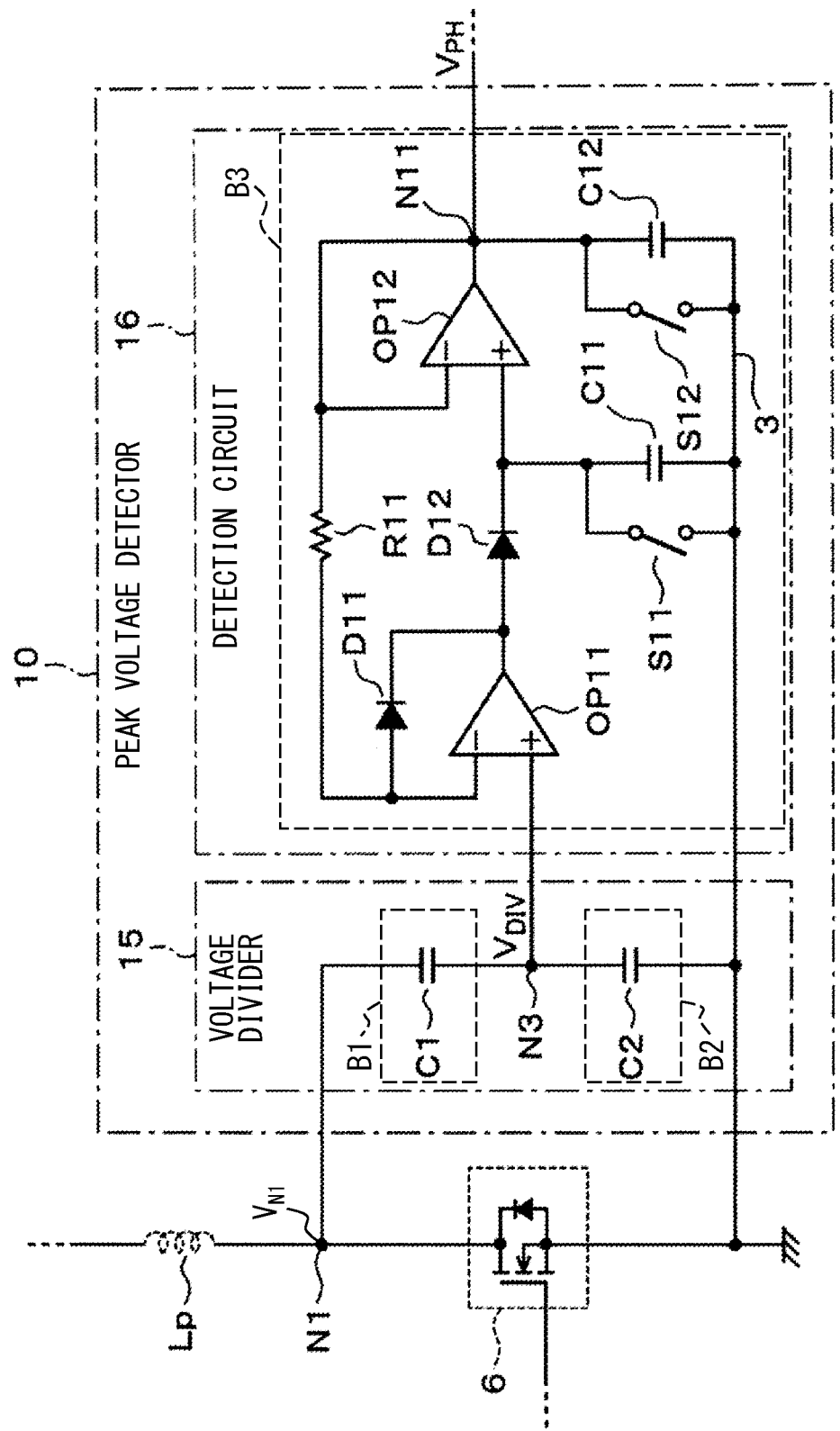
FIG. 15 illustrates a peak voltage detector including voltage dividing capacitors on separate bodies.

FIG. 15 illustrates a peak voltage detector 10 (for a gate drive circuit) including voltage dividing capacitors C1, C2 on separate bodies. Specifically, FIG. 15 is similar to FIG. 2 discussed above, with the following additional features.

The first capacitor C1 is on a first ceramic body B1. The second capacitor C1 is on a second ceramic body B2 that is distinct from the first ceramic body B1. The detection circuit 16 is on a third ceramic body B3 that is distinct from the other ceramic bodies B1 and B2. The third ceramic body B3 and the detection circuit 16 together form an integrated detection circuit. Bodies are also known as substrates or chips, and are often made of SiO2 or another ceramic.

The two capacitors C1 and C2 form the voltage divider 15, with a divided voltage VDIV (also known as an output voltage) formed across the second capacitor C2. The voltage divider 15 is a capacitive divider that does not pass any direct current (DC) input but does pass an alternating current (AC) input.

An input voltage VN1 is applied across the voltage divider, and creates the divided voltage VDIV according to equation 0 for an alternating current (AC).

$$VDIV=(C2/(C1+C2))\times VN1 \quad \text{Equation 1:}$$

Voltage dividers are sensitive to the accuracy of the capacitors under certain conditions, as discussed below.

FIG. 16—INTRODUCTION (CAPACITORS ON SAME BODY)

Figure 16:
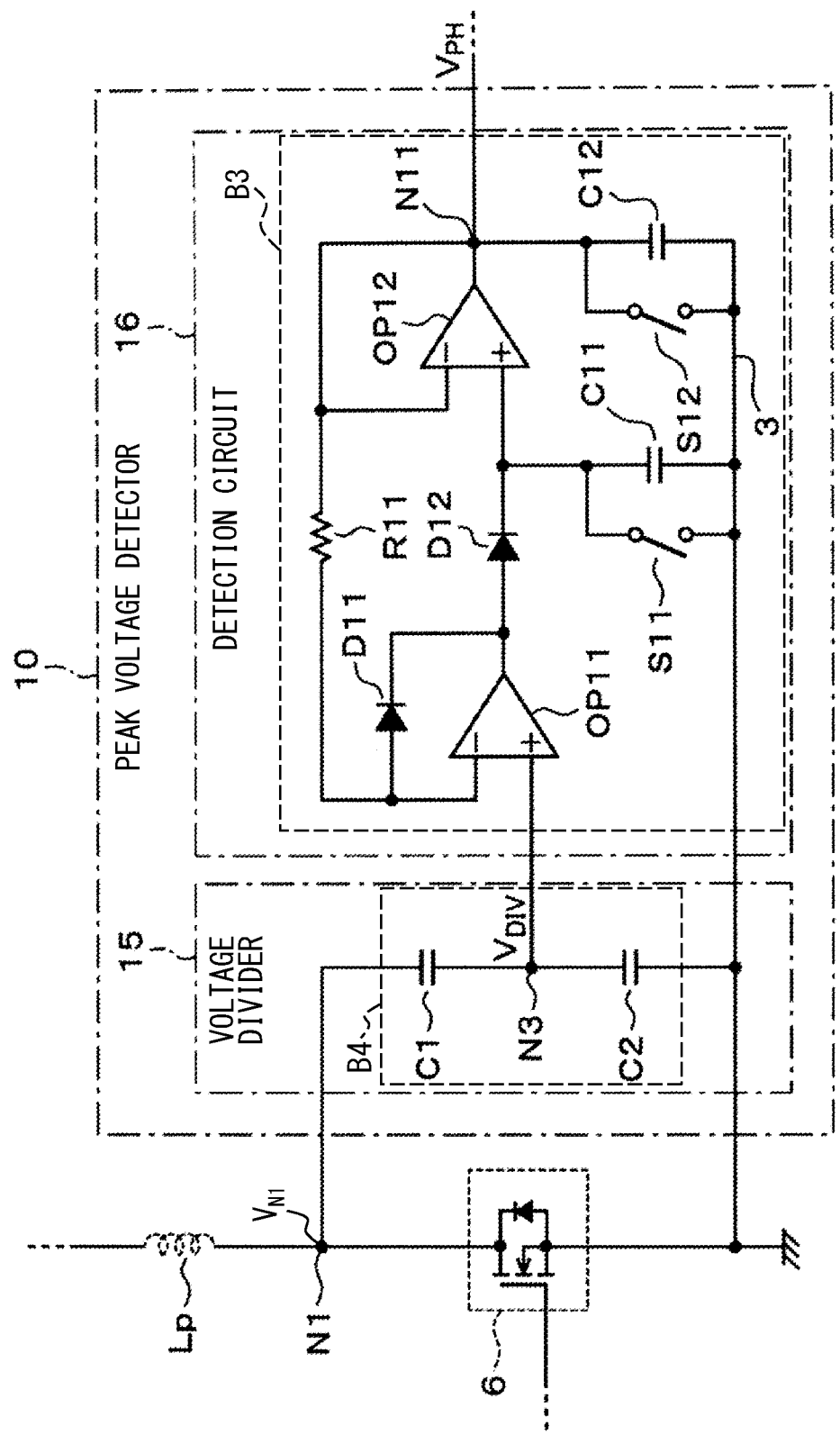
FIG. 16 illustrates a peak voltage detector including voltage dividing capacitors on a single body.

FIG. 16 illustrates a peak voltage detector 15 (for a gate drive circuit) including two capacitors on a single body.

Specifically, FIG. 15 is similar to FIG. 2 discussed above, with the following additional features.

The first capacitor C1 and the second capacitor C2 are formed on a fourth (unified, or integrated) ceramic body B4. This fourth ceramic body B4 combined with the voltage divider 15 forms an integrated voltage divider. The detection circuit 16 is on the third ceramic body B3 that is distinct from the fourth ceramic body B4. Bodies are also known as substrates or chips, and are often made of SiO2 or another ceramic.

FIGS. 15 AND 16—EXAMPLES

For illustrative purposes, below are five calculation examples.

Baseline Example: "100 to 1" Voltage Divider (100 Volts Input Generates 1 Volt Output)

$C2=1$ $C1=99$ $(C2+C1)=(1+99)$ $C2/(C2+C1)=1/100=0.0100$

Example A

C2 increased by 10%, C1 increased by 10%.

$C2=1+0.1=1.1$ $C1=99+9.9=108.9$ $(C2+C1)=(1.1+108.9)=110$ $C2/(C2+C1)=1.1/110=0.0100$

Thus, if both capacitors are increased by 10%, the voltage division remains constant (at 0.0100).

Example B

C2 decreased by 10%, C1 decreased by 10%.
Similar to Example A, if each capacitor is decreased by 10%, the voltage division remains constant (at 0.0100).

Example C

C2 decreased by 10%, C1 increased by 10%.

$C2=1-0.1=0.9$ $C1=99+9.9=108.9$ $(C2+C1)=(0.9+108.9)=109.8$ $C2/(C2+C1)=0.9/109.8=0.0082$ (18% decrease relative to 0.0100).

Example D

C2 increased by 10%, C1 decreased by 10%.

$C2=1+0.1=1.1$ $C1=99-9.9=89.1$ $(C2+C1)=(1.1+89.1)=90.2$ $C2/(C2+C1)=1.1/90.2=0.0122$ (22% increase relative to 0.0100).

To summarize, if the capacitors have the same magnitude of error in the same direction (such as Examples A and B), then the voltage division remains constant. If the capacitors have different magnitudes of error in the same direction (such as an increase of 2%, and an increase of 8%, no example shown), then the voltage division changes slightly. If the capacitors have errors in the opposite directions (such as Examples C and D), then voltage division may have large errors (from 18% decrease in Example C, to 22% increase in Example D). Examples C and D may be called unbalanced errors, or asymmetric errors.

Comparing Examples C and D, the range of the voltage division is 40% of the design value (from −18% to +22%).

FIGS. 15 AND 16—DESIGNING VOLTAGE DIVIDERS

Thus, when designing voltage dividers, it is important to determine whether the capacitors are separated (located on separate bodies), or are integrated (located on a single body). If the capacitors are separated, then a large error range must be considered when designing the remainder of the circuit. If the capacitors are integrated, then a small error range is considered (or the errors may be ignored). In addition to capacitance, similar issues exist regarding other properties such as: temperature coefficients, and DC bias characteristics.

For example, DC bias characteristics are discussed below in FIGS. 18 and 19.

FIG. 17—INTEGRATED PEAK VOLTAGE DETECTOR 10

Figure 17:
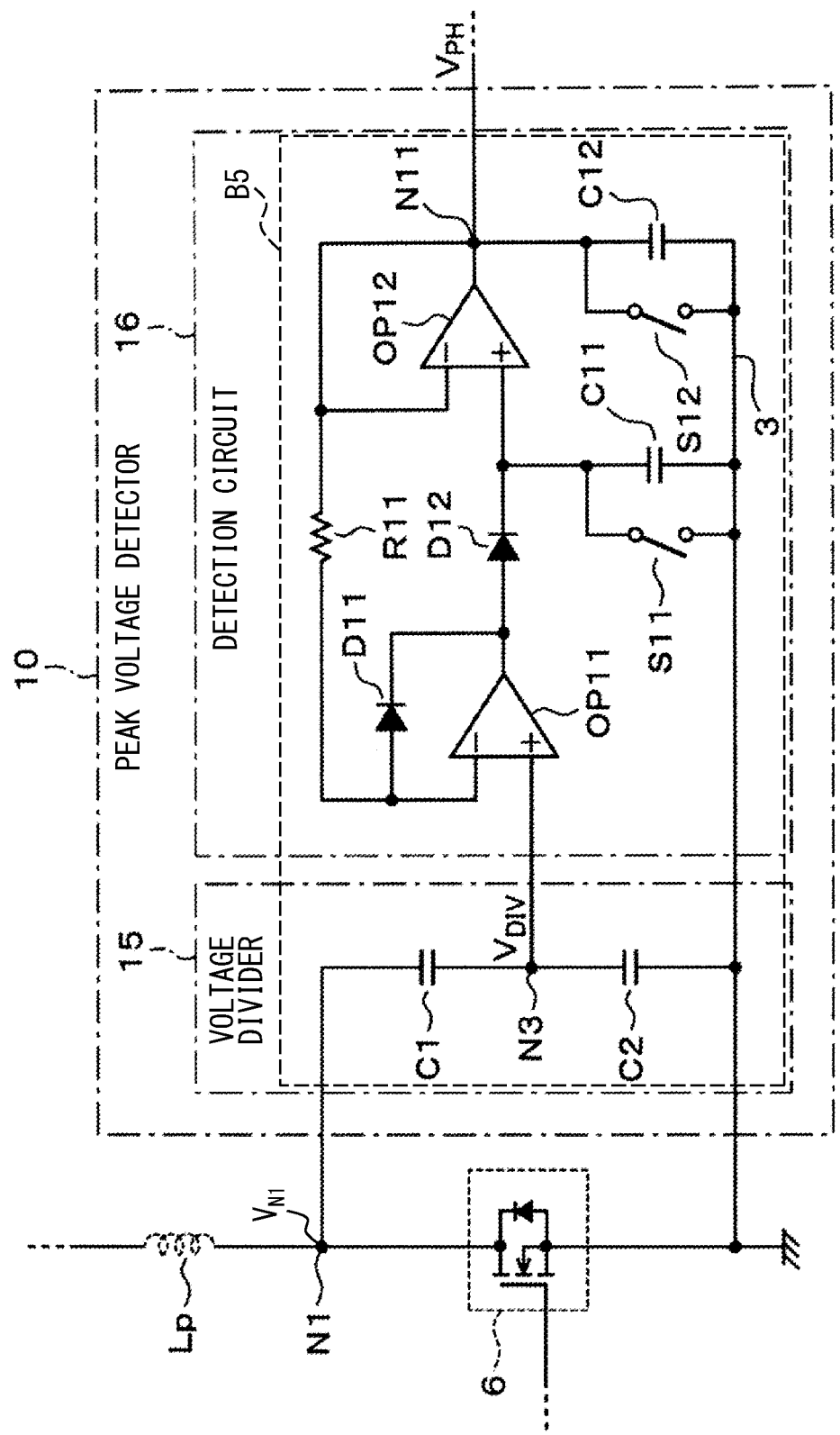
FIG. 17 illustrates a peak voltage detector including voltage dividing capacitors and a detection circuit on a single body.

FIG. 17 illustrates a peak voltage detector including voltage dividing capacitors and a detection circuit on a single ceramic body. Specifically, FIG. 17 is similar to FIG. 2 discussed above, with the following additional features.

A fifth ceramic body B5 includes the voltage divider 15 and the detection circuit 16. The fifth ceramic body B5 combined with the voltage divider 15 and the detection circuit 16 forms an integrated peak voltage detector. Integrating the peak voltage detector reduces parasitic inductance.

FIG. 18—DC BIAS CHARACTERISTICS FOR A GENERAL CERAMIC CAPACITOR

Figure 18:
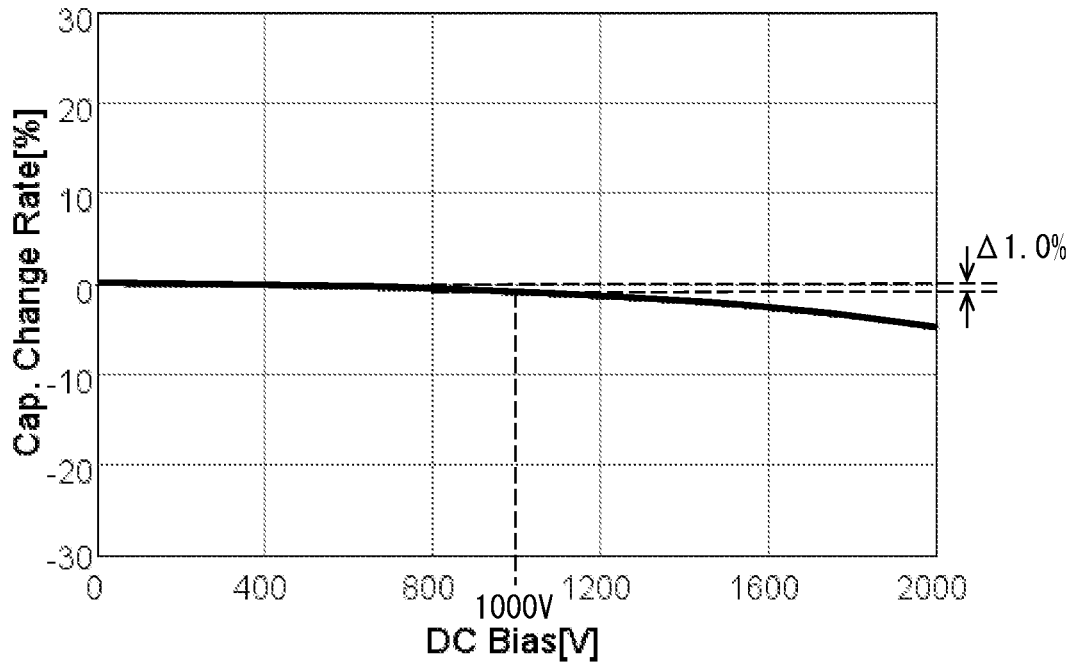
FIG. 18 illustrates DC bias characteristics for a general ceramic capacitor.

FIG. 18 illustrates DC bias characteristics for a general ceramic capacitor. Specifically, FIG. 18 shows a capacitance change rate as a function of a DC bias for a single general ceramic capacitor. The change rate is a relatively high 1% for a DC bias of 1000 volts DC.

FIG. 19—DC BIAS CHARACTERISTICS FOR A MIM CAPACITOR

Figure 19:
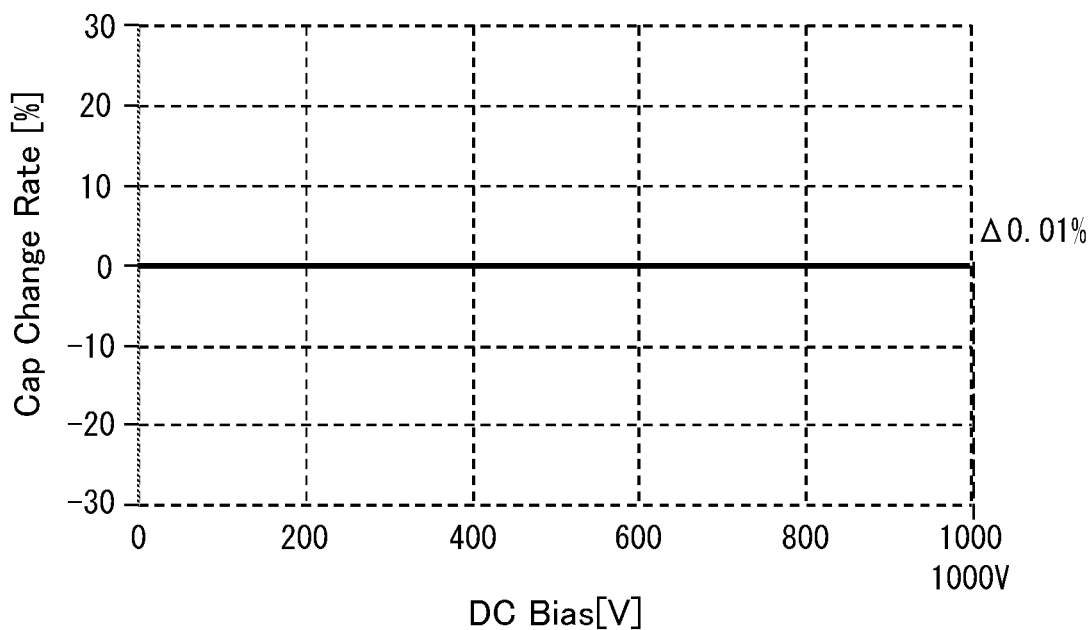
FIG. 19 illustrates DC bias characteristics for a high breakdown voltage metal-insulator-metal (MIM) capacitor.

FIG. 19 illustrates DC bias characteristics for a high breakdown voltage metal-insulator-metal (MIM) capacitor. Specifically, FIG. 19 shows a capacitance change rate as a function of a DC bias for a high breakdown voltage metal-insulator-metal (MIM) capacitor made by a thick film process. The change rate is a very low 0.01% for a DC bias of 1000 volts DC.

Other Embodiments

The present disclosure is not limited to the embodiments described above and shown in the drawings, and can be arbitrarily modified, combined, or expanded without departing from the spirit of the present disclosure. The numerical values used in the description of the embodiments are examples only, and are not limited to those example numerical values.

The capacitors C1 and C2 that make up the voltage divider 15 may be formed on different semiconductor chips so long as the desired capacitance ratio between the two capacitors C1 and C2 can be accurately achieved. The practical configuration of the peak voltage detector 10 is not limited to the configuration shown in FIG. 2. For example, the peak voltage detector 10 may have a peak hold circuit composed of a diode and a capacitor so long as the accuracy of the desired detection voltage $V_{PH}$ can be achieved.

The drive capacity calculator 11 configured to obtain the voltage deviation value ΔV for every PWM cycle in the above-described embodiments may also be configured to obtain the voltage deviation value ΔV once over a plurality of PWM cycles. The switching element 6 driven by the gate drive circuit 1 is not limited to being a power MOSFET, but may another power device such as an IGBT.

The load current detector 22 configured to detect the load current based on the current flowing in the sense cell is not limited to the above-described configuration, but may have, for example, a configuration for detecting the load current based on the terminal voltage of a shunt resistor inserted in series in the path of the main power supply. The configuration may arbitrarily be changed as appropriate.

The OFF voltage detector 32 is not limited to a configuration that detects the OFF voltage by sharing the voltage divider 15 in the peak voltage detector 10, and may be configured to have, for example, a dedicated voltage divider circuit to detect the OFF voltage. The configuration may arbitrarily be changed as appropriate.

The temperature detector 42 is not limited to a configuration that detects the temperature of the switching element (e.g., the switching element 44) based on the terminal voltage of the diode D41. For example, the configuration may be changed to detect the temperature of the switching element by using a dedicated temperature sensor.

In each of the above-described embodiments, the method for setting the drive capacity of the driver 9 is described as a method for changing the resistance value of the gate resistor R2. However, various other methods may be used to set the drive capacity. For example, in instances where the driver 9 is configured to drive the gate of the switching element 6 with a constant current, the driver 9 may implement a constant gate current drive method. The drive capacity may also be set by a method that changes the value of the gate current, or by a method that changes the value of the drive voltage.

Other methods for setting the drive capacity can also be adopted. That is, the value of the on resistance of the switch S2 may be changed by changing the gate voltage value of the transistor in the pre-driver stage, thereby changing the gate resistance value and thus setting the drive capacity of the driver 9. In addition, a plurality of transistors in the pre-driver stage may be connected in parallel, and the gate resistance value, and thus the drive capacity of the driver 9, may be set by appropriately selecting which of the one or more transistors to drive.

While the present disclosure has been described with reference to a plurality of embodiments, the present disclosure is not limited to the embodiments and modifications described above. The present disclosure covers various modification examples and equivalent arrangements. The above-described embodiment may be combined with one another where such a combination may include additional elements and features in the combination beyond those that existed before the combination. Similarly, a combination of embodiments may include less elements and features than those that existed in the original embodiments before the combination. That is, some elements and features in one embodiment may be omitted from the combination, when the one embodiment is combined with one or more other embodiments.

What is claimed is:

1. A gate drive circuit comprising:
a driver configured to drive a gate of a switching element;
a peak voltage detector configured to detect a peak voltage of a main terminal of the switching element when the switching element is OFF; and
a drive capacity calculator configured to calculate a difference between a peak voltage detection value detected by the peak voltage detector and an allowable voltage value of the main terminal of the switching element, and to change a drive capacity of the driver to gradually decrease the difference, wherein:
the peak voltage detector includes:
a voltage divider configured to input and divide a voltage at the main terminal of the switching element and to output a divided voltage; and
a peak hold circuit configured to input the divided voltage from the voltage divider and output a peak hold voltage that holds a peak value of the divided input voltage,
the voltage divider dividing high voltage includes a plurality of capacitors having high capacitance connected in series, the plurality of capacitors formed on one semiconductor chip for relative accuracy of capacitance,
the gate drive circuit further comprises a current detector configured to detect a load current in the switching element,
the drive capacity calculator is further configured to adjust the drive capacity based on the load current detected by the current detector,
the switching element includes a main cell and a sense cell,
the current detector is further configured to detect the load current based on an electric current in the sense cell,
the gate drive circuit further comprises a temperature detector configured to detect a temperature of the switching element, and
the drive capacity calculator is further configured to adjust the drive capacity based on the temperature of the switching element detected by the temperature detector.

2. The gate drive circuit of claim 1, wherein
the peak hold circuit is a semiconductor integrated circuit, and
the plurality of capacitors are integrally formed on the semiconductor integrated circuit on which the peak hold circuit is formed.

3. The gate drive circuit of claim 1, wherein
the peak hold circuit includes OP amplifiers and capacitors and is configured to hold a maximum value of the divided voltage in the capacitors by using a negative feedback effect, and
the peak hold circuit includes a reset switch for resetting an electric charge of the capacitors.

4. The gate drive circuit of claim 1, wherein
the drive capacity calculator is further configured
to calculate the difference between the peak voltage detection value and the allowable voltage value either in every drive cycle of the switching element or over a plurality of drive cycles of the switching element, and
to change the drive capacity in a predetermined drive cycle based on the difference between the peak voltage detection value and the allowable voltage value calculated in a drive cycle prior to the predetermined drive cycle.

5. The gate drive circuit of claim 1, wherein
the drive capacity calculator is further configured to maximize the drive capacity when the load current is less than or equal to a predetermined lower limit determination value.

6. The gate drive circuit of claim 1 further comprising:
a voltage detector configured to detect a power source voltage that is applied to a main terminal of the switching element when the switching element is OFF, wherein
the drive capacity calculator is further configured to adjust the drive capacity based on the power source voltage detected by the voltage detector.

7. The gate drive circuit of claim 6, wherein
the peak voltage detector and the voltage detector are respectively configured to detect the peak voltage and the power source voltage based on a voltage from the main terminal of the switching element.

8. The gate drive circuit of claim 6, wherein
the drive capacity calculator is further configured to maximize the drive capacity when the detection value of the power source voltage is less than or equal to a preset lower limit determination value.

9. The gate drive circuit of claim 1 further comprising:
a plurality of switching elements, the plurality of switching elements forming a plurality of half bridge circuits for a plurality of voltage phases, wherein
the drive capacity calculator is further configured to determine the allowable voltage value individually for each of the plurality of switching elements.

10. The gate drive circuit of claim 9, wherein
the drive capacity calculator is further configured to obtain drive capacity information for a drive capacity of a driver in another gate drive circuit, and wherein
the allowable voltage value is determined based on the drive capacity information.

11. The gate drive circuit of claim 1, wherein
the drive capacity calculator includes a storage configured to store a map that associates an optimum value of the drive capacity of the driver with at least one of:
(i) a load current in the switching element,
(ii) a power source voltage applied to the main terminal of the switching element when the switching element is OFF, and
(iii) a temperature of the switching element, and wherein
the drive capacity calculator is further configured to update the map stored in the storage to gradually decrease the difference between the detected peak voltage and the allowable voltage value, and to determine the drive capacity based on the map.

12. A gate drive circuit comprising:
a driver configured to drive a gate of a switching element;
a peak voltage detector configured to detect a peak voltage of the main terminal of the switching element when the switching element is OFF; and
a drive capacity calculator configured to calculate a difference between a peak voltage detection value detected by the peak voltage detector and an allowable voltage value of the main terminal of the switching element, and to change a drive capacity of the driver to gradually decrease the difference, wherein:

the peak voltage detector includes:
- a voltage divider configured to input and divide a voltage at the main terminal of the switching element and to output a divided voltage; and
- a peak hold circuit configured to input the divided voltage from the voltage divider and output a peak hold voltage that holds a peak value of the divided input voltage, the voltage divider dividing high voltage includes a plurality of capacitors having high capacitance connected in series, the plurality of capacitors formed on one semiconductor chip for relative accuracy of capacitance, the peak hold circuit includes OP amplifiers and capacitors and is configured to hold a maximum value of the divided voltage in the capacitors by using a negative feedback effect, and the peak hold circuit includes a reset switch for resetting an electric charge of the capacitors.

13. A gate drive circuit comprising:

a driver configured to drive a gate of a switching element;

a peak voltage detector configured to detect a peak voltage of a main terminal of the switching element when the switching element is OFF; and a drive capacity calculator configured to calculate a difference between a peak voltage detection value detected by the peak voltage detector and an allowable voltage value of the main terminal of the switching element, and to change a drive capacity of the driver to gradually decrease the difference, wherein:

the peak voltage detector includes:
- a voltage divider configured to input and divide a voltage at the main terminal of the switching element and to output a divided voltage; and
- a peak hold circuit configured to input the divided voltage from the voltage divider and output a peak hold voltage that holds a peak value of the divided input voltage, the voltage divider dividing high voltage includes a plurality of capacitors having high capacitance connected in series, the plurality of capacitors formed on one semiconductor chip for relative accuracy of capacitance, the gate drive circuit further comprises a current detector configured to detect a load current in the switching element, the drive capacity calculator is further configured to adjust the drive capacity based on the load current detected by the current detector, the switching element includes a main cell and a sense cell, the current detector is further configured to detect the load current based on an electric current in the sense cell, the gate drive circuit further comprises a plurality of switching elements, the plurality of switching elements forming a plurality of half bridge circuits for a plurality of voltage phases, the drive capacity calculator is further configured to determine the allowable voltage value individually for each of the plurality of switching elements, the drive capacity calculator is further configured to obtain drive capacity information for a drive capacity of a driver in another gate drive circuit, and the allowable voltage value is determined based on the drive capacity information.

* * * * *